US011314292B2

(12) United States Patent
Christensen

(10) Patent No.: US 11,314,292 B2
(45) Date of Patent: Apr. 26, 2022

(54) FLEXIBLE MOUNTING CONFIGURATIONS FOR DATA STORAGE DRIVES IN INFORMATION HANDLING SYSTEMS

(71) Applicant: DELL PRODUCTS L.P., Round Rock, TX (US)

(72) Inventor: Steven M. Christensen, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 179 days.

(21) Appl. No.: 16/780,109

(22) Filed: Feb. 3, 2020

(65) Prior Publication Data

US 2021/0240235 A1 Aug. 5, 2021

(51) Int. Cl.
   *G06F 1/18* (2006.01)
   *G11B 33/04* (2006.01)
   *H05K 5/02* (2006.01)
   *G11B 23/03* (2006.01)

(52) U.S. Cl.
   CPC .............. *G06F 1/187* (2013.01); *G06F 1/181* (2013.01); *G11B 23/0322* (2013.01); *G11B 33/0405* (2013.01); *H05K 5/0221* (2013.01)

(58) Field of Classification Search
   CPC ..... G06F 1/187; G06F 1/181; G11B 33/0405; G11B 23/0322; H05K 5/0221
   See application file for complete search history.

(56) References Cited

U.S. PATENT DOCUMENTS

| 5,584,396 | A | * | 12/1996 | Schmitt | H02B 1/36 |
| | | | | | 211/26 |
| 6,530,551 | B2 | * | 3/2003 | Gan | G06F 1/184 |
| | | | | | 248/694 |
| 6,826,055 | B2 | * | 11/2004 | Mease | G06F 1/184 |
| | | | | | 312/223.1 |
| 7,012,803 | B1 | * | 3/2006 | Austin | G06F 1/184 |
| | | | | | 361/679.33 |
| 7,433,183 | B2 | * | 10/2008 | Huang | G06F 1/187 |
| | | | | | 312/223.2 |
| 9,141,153 | B2 | | 9/2015 | Mundt et al. | |
| 9,265,173 | B1 | * | 2/2016 | Jhang | G06F 1/187 |
| 9,317,081 | B2 | | 4/2016 | Mundt et al. | |

(Continued)

*Primary Examiner* — Hung S. Bui
*Assistant Examiner* — Sagar Shrestha
(74) *Attorney, Agent, or Firm* — Egan, Enders & Huston LLP.

(57) ABSTRACT

Systems and methods that may be employed for mounting data storage drives (e.g., HDDs, SSDs, etc.) within a chassis of an information handling system using storage drive carrier retaining features of a chassis and mating securing features of a storage drive carrier to provide a tool-less storage drive carrier mounting solution for an information handling system chassis that accommodates both cost-effective tooled storage drive carrier and premium tool-less storage drive carrier mounting configurations, e.g., without additional investment or reconfiguration of the chassis for either type of mounting configuration. The disclosed systems and methods may be further so implemented in a manner that without the presence of one or more drive bays within the chassis interior that may restrict access to the chassis interior and which may require a larger chassis and chassis enclosure to contain bay/s.

20 Claims, 16 Drawing Sheets

(56) References Cited

U.S. PATENT DOCUMENTS

| | | | |
|---|---|---|---|
| 9,699,931 B1* | 7/2017 | Chen | H05K 7/1489 |
| 9,781,857 B2* | 10/2017 | Jau | H05K 7/1487 |
| 10,111,365 B1* | 10/2018 | Junkins | H05K 7/20254 |
| 10,409,753 B2 | 9/2019 | Matula et al. | |
| 10,423,198 B1* | 9/2019 | Tsai | H05K 7/1489 |
| 10,665,269 B1* | 5/2020 | Shen | G11B 33/022 |
| 11,096,305 B1* | 8/2021 | Peng | H05K 7/1487 |
| 2005/0068720 A1* | 3/2005 | Lambert | G06F 1/184 |
| | | | 361/679.03 |
| 2006/0171109 A1* | 8/2006 | Chang | G06F 1/184 |
| | | | 361/679.33 |
| 2008/0116774 A1* | 5/2008 | Chen | G06F 1/187 |
| | | | 312/223.2 |
| 2008/0218958 A1* | 9/2008 | Chen | G06F 1/181 |
| | | | 361/727 |
| 2013/0127310 A1* | 5/2013 | Yu | G11B 33/128 |
| | | | 312/223.2 |
| 2014/0362515 A1* | 12/2014 | Pronozuk | H05K 7/1487 |
| | | | 361/679.31 |
| 2016/0054767 A1* | 2/2016 | Chen | G06F 1/187 |
| | | | 361/679.39 |
| 2017/0347481 A1* | 11/2017 | Kuan | G06F 1/181 |

\* cited by examiner

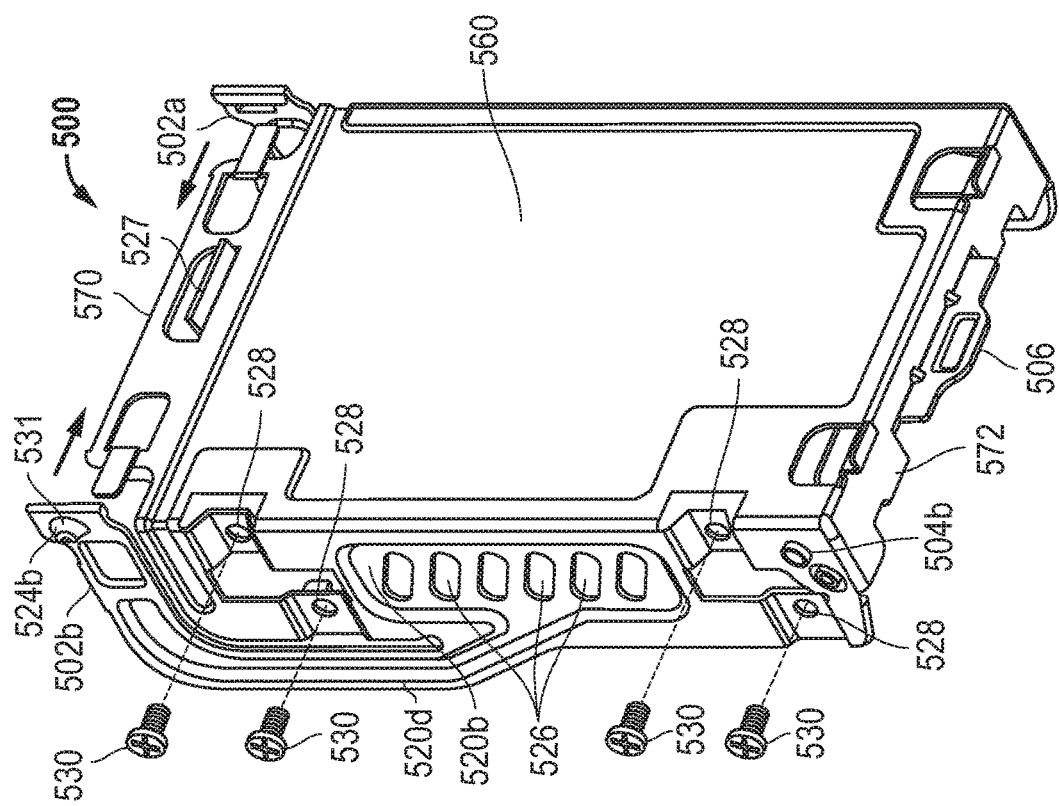

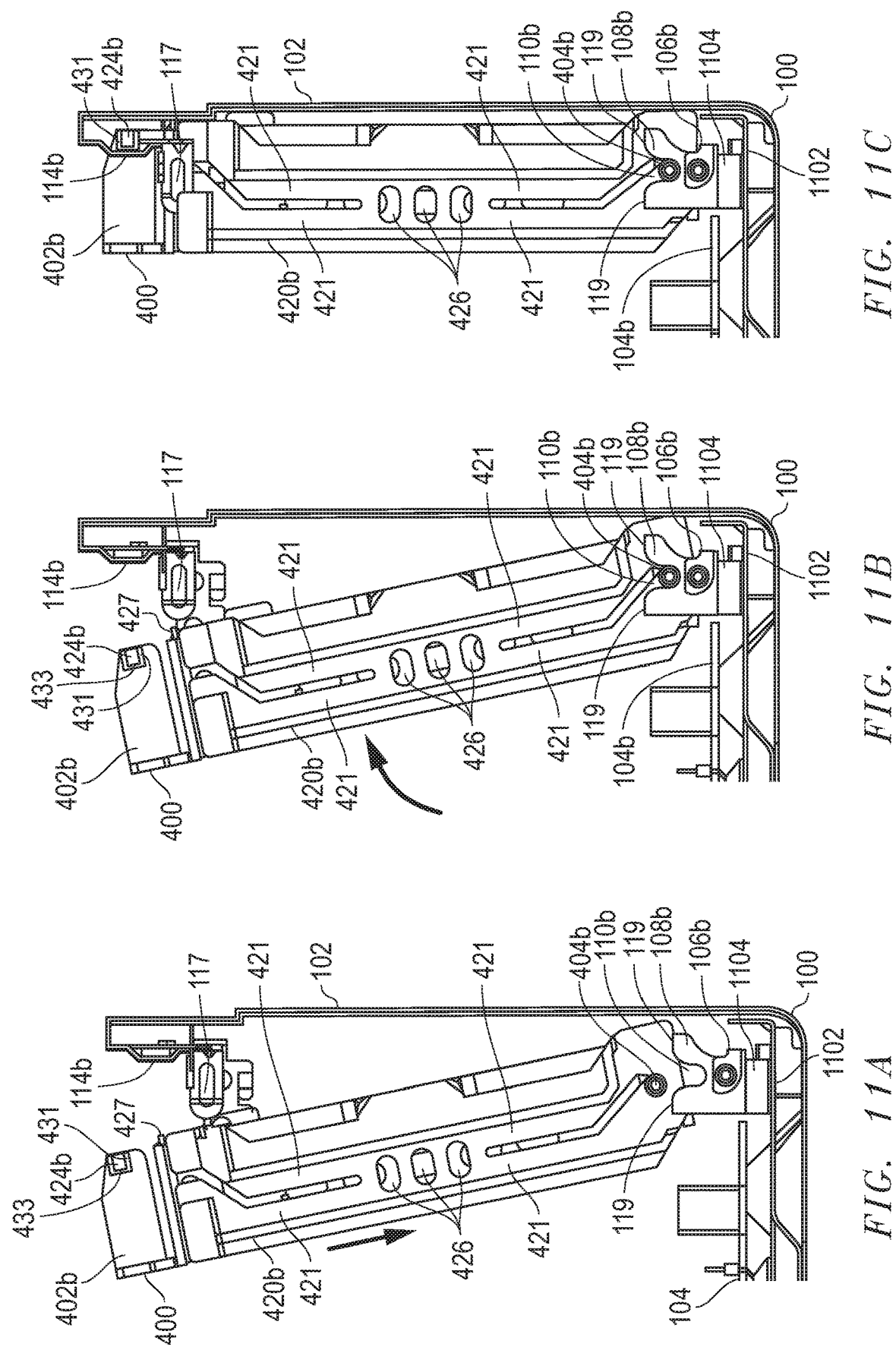

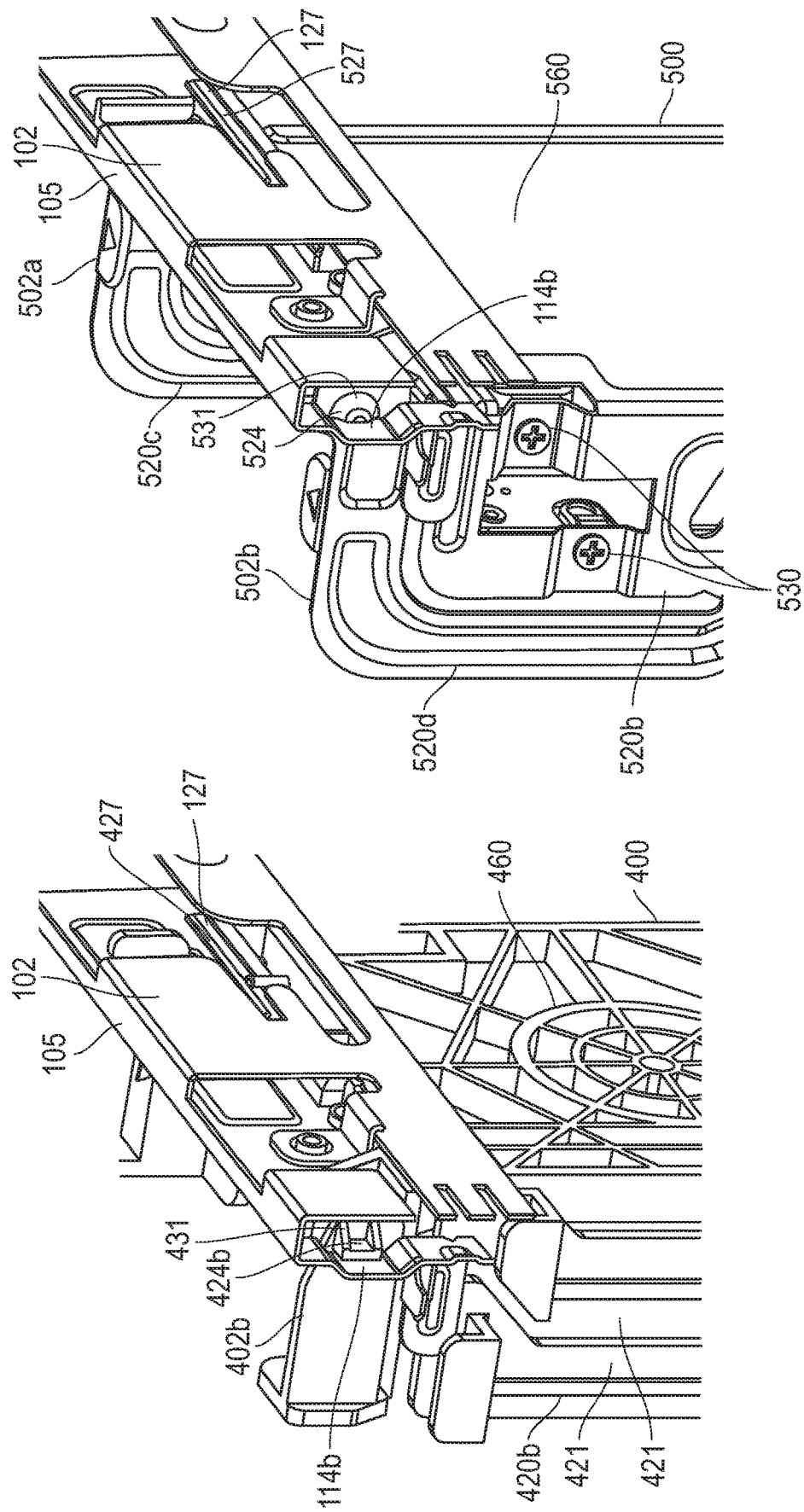

FLEXIBLE MOUNTING CONFIGURATIONS FOR DATA STORAGE DRIVES IN INFORMATION HANDLING SYSTEMS

FIELD

This invention relates generally to information handling systems and, more particularly, to data storage drive mounting for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Typical desktop computers include drive bays that each receive and support a storage drive carrier (also known as a drive caddy) that contains and supports a Hard Disk Drive (HDD) or a Solid State Drive (SSD). A typical drive bay is an elongated sheet metal container having enclosure walls and an open end through which the drive carrier is inserted together with its HDD or SSD into the drive bay. The inserted drive carrier is then secured within the drive bay by one or more screws received by the drive carrier through an opening defined in a sidewall of the drive bay.

A hard disk drive (HDD) or solid state drive (SSD) may be conventionally mounted within a drive carrier in a tooled or tool-less configuration. A typical conventional metal tooled type-mount drive carrier is constructed of a rigid or semi-rigid sheet metal enclosure sized to receive the HDD or SSD, and into which a HDD or SSD is inserted and secured with fasteners, such as by screws received into a side of the drive through an opening defined in a sidewall of the tooled drive carrier. A more expensive premium tool-less drive carrier is typically constructed of a flexible plastic enclosure provided with integral retaining features extending inward from interior side walls of the drive carrier, and which are configured to be received within a side/s of a HDD or SSD to secure the HDD or SSD in the drive carrier. A tool-less drive carrier is dimensioned such that insertion of a HDD or SSD into the drive carrier requires a sidewall portion of the drive carrier to be flexed outward with its retaining features to create clearance for the HDD or SSD to be inserted. Once the HDD or SSD is inserted into the tool-less drive carrier, the drive carrier sidewall/s are allowed to return inward such that their retaining features mechanically engage the inserted HDD or SSD within the tool-less drive carrier. Serviceability expectations vary for conventional HDD and SSD mounting in desktop computers, with some users preferring tool-less drive mount service at a higher cost, while other users prefer lower cost tooled mount service.

SUMMARY

Disclosed herein are systems and methods for mounting data storage drives (e.g., storage drives such as hard disk drives "HDDs", solid state drives "SSDs", etc.) within a chassis of an information handling system, e.g., for example desktop and tower computer systems. The disclosed systems may be implemented in one embodiment using storage drive carrier retaining features of a chassis together with mating securing features of a storage drive carrier (i.e., a hard drive carrier or other type of storage drive carrier) to provide a simple, relatively low-cost tool-less storage drive carrier mounting solution for an information handling system chassis that accommodates both cost-effective tooled storage drive carrier and premium tool-less storage drive carrier mounting configurations, e.g., without additional investment or reconfiguration of the chassis for either type of mounting configuration. In one embodiment, the disclosed systems and methods may be further so implemented in a manner that does not include one or more drive bays within the chassis interior that may restrict access to the chassis interior and which may require a larger chassis and chassis enclosure to contain bay/s.

In one embodiment, the disclosed systems and methods may be implemented with the storage drive carrier retaining and securing features to provide a common information handling system chassis hardware component that may be employed to build-to-order a drive-less system with no caddies, a system with one or more cost-effective tooled metal caddies, or a more expensive premium system with more one or more costly tool-less plastic caddies, e.g., to meet the requirements of an individual customer order. In a further embodiment, such storage drive carrier retaining and securing features may be utilized to allow tool-less and tooled drive caddies to be later interchanged on a deployed information handling system chassis in the field after original information handling system manufacture, and/or to allow a tool-less or tooled storage drive carrier to be later installed in a deployed information handling system chassis in the field that was originally manufactured with a chassis having no installed drives.

In one embodiment, the disclosed systems and methods may be implemented with a set of chassis mounting structural retaining features that are configured to allow the same information handling system chassis to accept either a tool-less storage drive carrier (e.g., a premium relatively higher cost plastic storage drive carrier) or a tooled storage drive carrier (e.g., a relatively lower cost sheet metal tooled storage drive carrier), without requiring any reconfiguration of the same chassis to accept either tool-less or tooled type of storage drive carrier. In one embodiment, the disclosed system and methods may be so implemented without the presence of a conventional dedicated drive bay to support a data storage drive/s within the information handling system chassis, thus reducing cost and saving space within the chassis. In one embodiment, tooled and tool-less caddies may be provided that are designed for different cost and serviceability requirements, but that advantageously utilize the same mounting, latching and vibration damping features for mounting within a common information handling system chassis.

In one embodiment, the disclosed systems and methods may be implemented to provide a single mounting solution (e.g., set of storage drive carrier retaining features) to directly mount multiple types of drive caddies of varying construction and design within an information handling system chassis in an interchangeable manner, without requiring cost of a space-consuming drive bay or the use of tools, and without requiring chassis reconfiguration. A single set of chassis structural retaining features may be provided and integrated within the information handling system chassis for guiding, mounting, and latching either a tooled or tool-less storage drive carrier within the chassis. Mating tooled and tool-less drive caddie configurations may also be provided that share common structural features for guiding, pivoting, latching and vibration damping when mounted within the chassis. In this regard, individual tooled and tool-less drive caddies designed for different cost and serviceability requirements may be configured to utilize the same securing features for guiding, pivoting mounting, latching and vibration damping to mount the different type caddies into the same information handling chassis using the same storage drive carrier retaining features of the chassis.

In one respect, disclosed herein is a system, including: a chassis having at least one keeper and first and second retainers, the first and second retainers being spaced apart to receive a storage drive carrier between the first and second retainers; where a first opening is defined in the first retainer and a second opening is defined in the second retainer, the first opening being configured to receive a first pin extending outward from a first side of the storage drive carrier at the same time that the second opening receives a second pin extending outward from an opposite second side of the storage drive carrier; and where the keeper is configured to engage a latch extending from the storage drive carrier at the same time that the first and second pins are received by the respective first and second openings to mechanically secure the storage drive carrier to the chassis.

In another respect, disclosed herein is a method, including: positioning a storage drive carrier between first and second retainers of a chassis, a first opening defined in the first retainer and a second opening defined in the second retainer; simultaneously positioning a first pin extending outward from a first side of the storage drive carrier into the first opening and a second pin extending outwardly from an opposite second side of the storage drive carrier into the second opening, the first and second pins defining a pivot axis therebetween; and pivoting the storage drive carrier about the pivot axis to engage a latch extending from the storage drive carrier in a direction perpendicular to the pivot axis with a keeper of the chassis at the same time that the first and second pins are received by the respective first and second openings to mechanically secure the storage drive carrier to the chassis.

In another respect, disclosed herein is a storage drive carrier, including: a first pin extending outward from a first side of the storage drive carrier, and a second pin extending outward from an opposite second side of the storage drive carrier to define a pivot axis therebetween, each of the first and second sides of the storage drive carrier extending from a proximal end of the storage drive carrier to a distal end of the storage drive carrier; and at least one latch extending from the storage drive carrier in a direction perpendicular to the pivot axis.

BRIEF DESCRIPTION OF THE DRAWINGS

FIG. 8 illustrates a distal end back side perspective view of a tool-less storage drive carrier according to one exemplary embodiment of the disclosed systems and methods.

FIG. 9 illustrates a distal end back side perspective view of a tooled storage drive carrier according to one exemplary embodiment of the disclosed systems and methods.

FIG. 11A illustrates a partial cross-sectional view of a tool-less storage drive carrier and information handling system chassis according to one exemplary embodiment of the disclosed systems and methods.

FIG. 11B illustrates a partial cross-sectional view of a tool-less storage drive carrier and information handling system chassis according to one exemplary embodiment of the disclosed systems and methods.

FIG. 11C illustrates a partial cross-sectional view of a tool-less storage drive carrier and information handling system chassis according to one exemplary embodiment of the disclosed systems and methods.

FIG. 12A illustrates a partial back side cross-sectional perspective view of a proximal end of a tool-less storage drive carrier mounted to an information handling system chassis according to one exemplary embodiment of the disclosed systems and methods.

FIG. 12B illustrates a partial back side cross-sectional perspective view of a proximal end of a tooled storage drive carrier mounted to an information handling system chassis according to one exemplary embodiment of the disclosed systems and methods.

DESCRIPTION OF ILLUSTRATIVE EMBODIMENTS

Figure 1A:
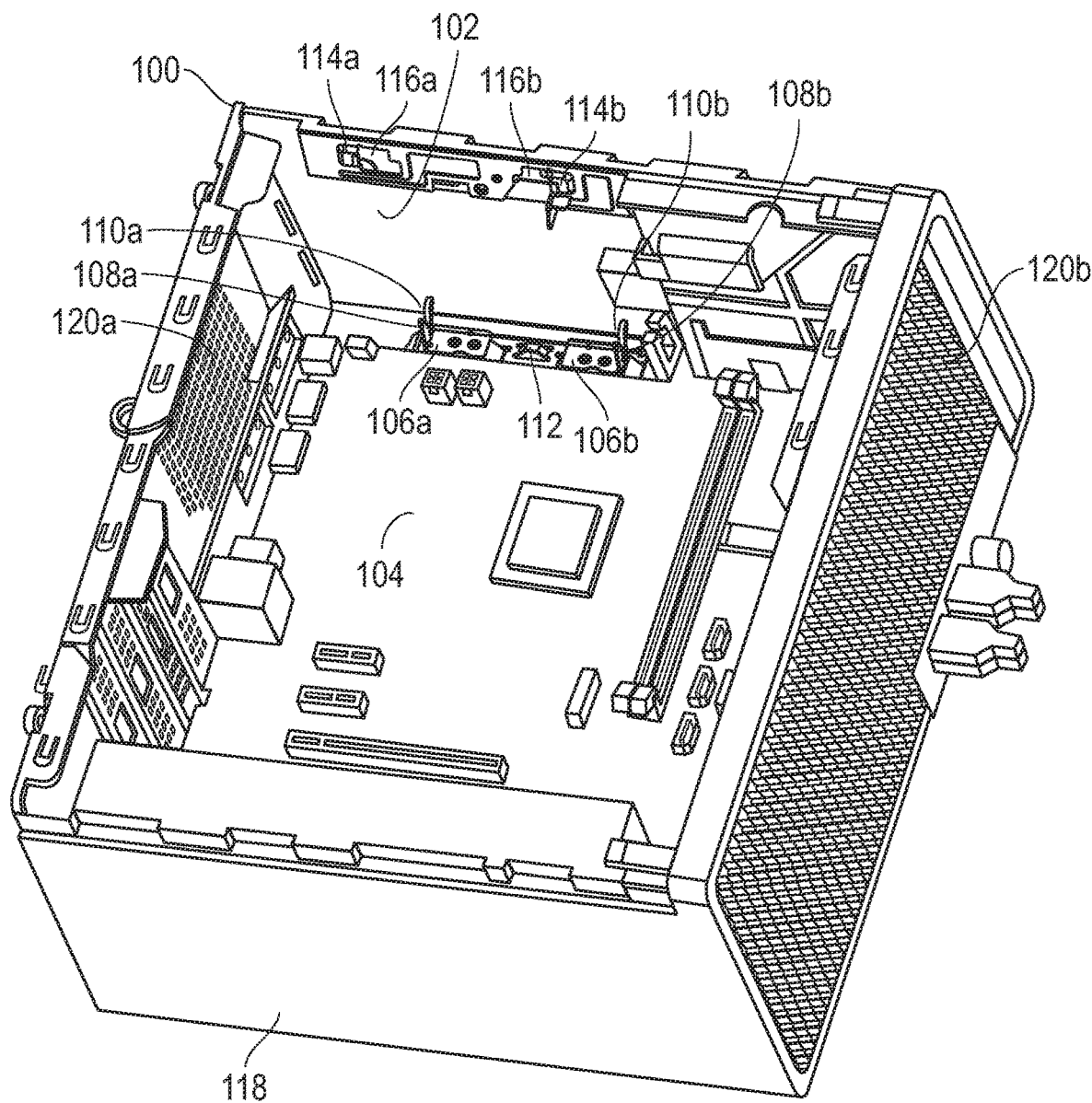
FIG. 1A illustrates a right side perspective view of an information handling system chassis according to one exemplary embodiment of the disclosed systems and methods.
Figure 3:
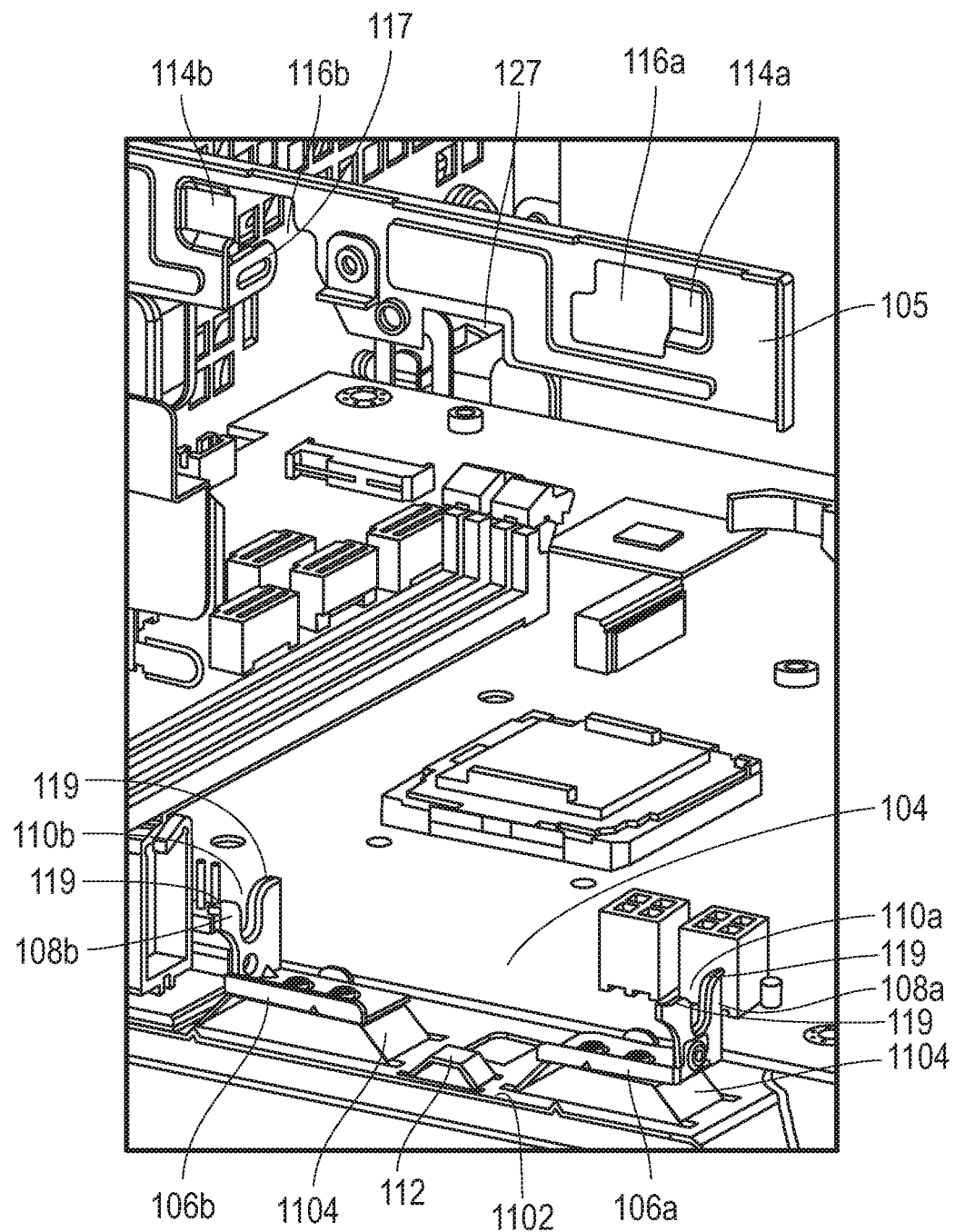
FIG. 3 illustrates an enlarged partial back side perspective view of drive carrier retaining structural features according to one exemplary embodiment of the disclosed systems and methods.

FIG. 1A illustrates a right side perspective view of one embodiment of an information handling system chassis 100 (e.g., tower computer chassis, desktop computer chassis, server chassis, etc.) with its left side cover removed to expose an interior cavity defined between chassis enclosure walls of chassis top 102, chassis bottom 118, chassis right side 104 and chassis back 120*a* and front 120*b*. As shown in FIG. 3, chassis 100 may contain various information handling system electronic components that are coupled together in operational relationship by data bus/es to exchange and process data. Such components may include, for example, central processing unit (CPU), volatile and non-volatile memory, data buses, network interface controller (NIC), embedded controller (EC), baseboard management controller (BMC), graphics processing unit (GPU), power supply, etc. In FIG. 3, some examples of these electronic component and/or connector for same are shown coupled or otherwise mounted to wall of chassis right side 104. Further information on information handling system components and operation may be found, for example, in U.S. Pat. No. 10,409,753, which is incorporated herein by reference in its entirety for all purposes.

In FIG. 1A, chassis enclosure walls 102, 118, 140, 120*a* and 120*b* may be any suitable chassis wall material, e.g., such as sheet metal and/or plastic. In the illustrated embodiment of FIG. 1A, integrated storage drive carrier retaining features for receiving and mounting data storage drives within chassis 100 are provided, and may be formed by sheet metal punch outs and/or molded plastic. These storage drive carrier retaining features include a pair of keepers 114*a* and 114*b* (which are provided as latch points or features to receive latches 424 described further herein) and a corresponding pair of latch openings 116*a* and 116*b* provided on (e.g., formed from) the inside of chassis top 102, together with a pair of retainers 108*a* and 108*b* that define and support a corresponding pair of saddle openings 110*a* and 110*b* provided on the inside of chassis right side 104, which is oriented 90 degrees from chassis top 102. In the illustrated embodiment, keepers 114 and latch openings 116 are defined as shown in a doubled wall 105 of chassis top, e.g., to provide clearance for insertion of latch arms 424 or 524 as illustrated and described further herein.

As describe further herein, each of saddle openings 110*a* and 110*b* may be an open slot having a terminal end size and shape that is complimentary to the outer dimensions of a pivot pin 404 or 504, such that a pivot pin 404 or 504 fits securely within each saddle opening 100 to allow the inserted pivot pin 404 or 504 to rotate within the saddle opening 110 but at the same time with no freedom of back and forth reciprocating movement of pivot pin 404 or 504 between the inner sides of the saddle opening 110. In this embodiment, retainers 108*a* and 108*b* are in turn coupled to chassis right side 104 via retainer support plates 106*a* and 106*b*.

Other optional storage drive carrier retaining features include, for example, a key opening 127 (e.g., rectangular-shaped slot or other suitably shaped opening) that is defined in chassis top 102 adjacent and between latch openings 116*a* and 116*b* to assist with aligning a storage drive carrier 400 or 500 during mounting operations and/or to prevent lateral side-to-side movement of a mounted storage drive carrier 400 or 500, and a preload protrusion 112 provided as shown on chassis right side 104 in a position between retainers 108*a* and 108*b*. Preload protrusion 112 may be, for example, a metal protrusion coated with a resilient material (e.g., rubber such as polybutadiene, styrene butadiene rubber, or other resilient material). Alternatively, preload protrusion 112 may be a block of such a rubber or other resilient material. Stabilizer 117 may also be provided as shown to contact a side of a mounted storage drive carrier 400 or 500 to further prevent movement of the mounted storage drive carrier relative to the chassis 100, e.g., such as during physical shock events that may occur during shipment of the chassis 100. Stabilizer 117 may also prevent latch arms 424 or 524 (described further herein) from bending and disengaging during such shock events. Retainers 108*a* and 108*b* may also be provided with optional extensions 119 on either side of each saddle opening 110, e.g., to function as stabilizers to further stabilize the mounted position of a storage drive carrier 400 or 500 during physical shock events and/or to assist with alignment and insertion of a pivot pin 404 or 504 (also described further herein).

Although shown provided on adjacent chassis top 102 and chassis right side 104 in FIG. 1A, it will be understood that in other embodiments drive carrier retaining structural features may be similarly provided on the inside of any combination of two adjacent chassis enclosure walls that are oriented 90 degrees to each other, e.g., such as on adjacent chassis bottom 118 and chassis right side 104, chassis back 120*a* and chassis top 102, chassis bottom 118 and chassis back 120*a*, chassis front 120*b* and chassis top 102, chassis front 120*b* and chassis bottom 118, etc. Moreover, in the illustrated embodiment, chassis 100 has no dedicated bay for receiving one or more drive caddies. However, in other embodiment, one or more optional dedicated drive bays may also be present in addition to the drive carrier retaining structural features disclosed herein.

Figure 1B:
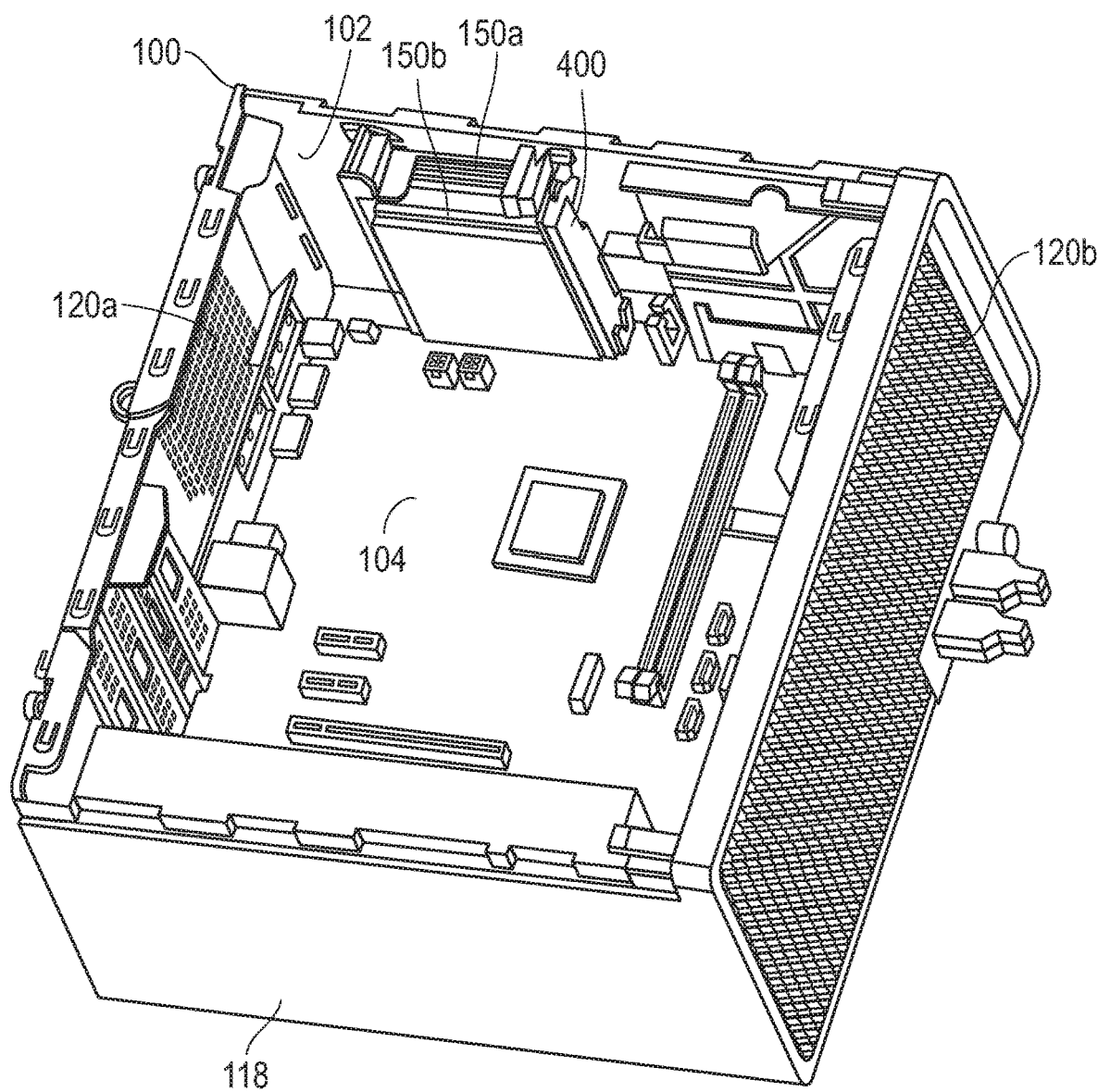
FIG. 1B illustrates a right side perspective view of an information handling system chassis according to one exemplary embodiment of the disclosed systems and methods.
Figure 1C:
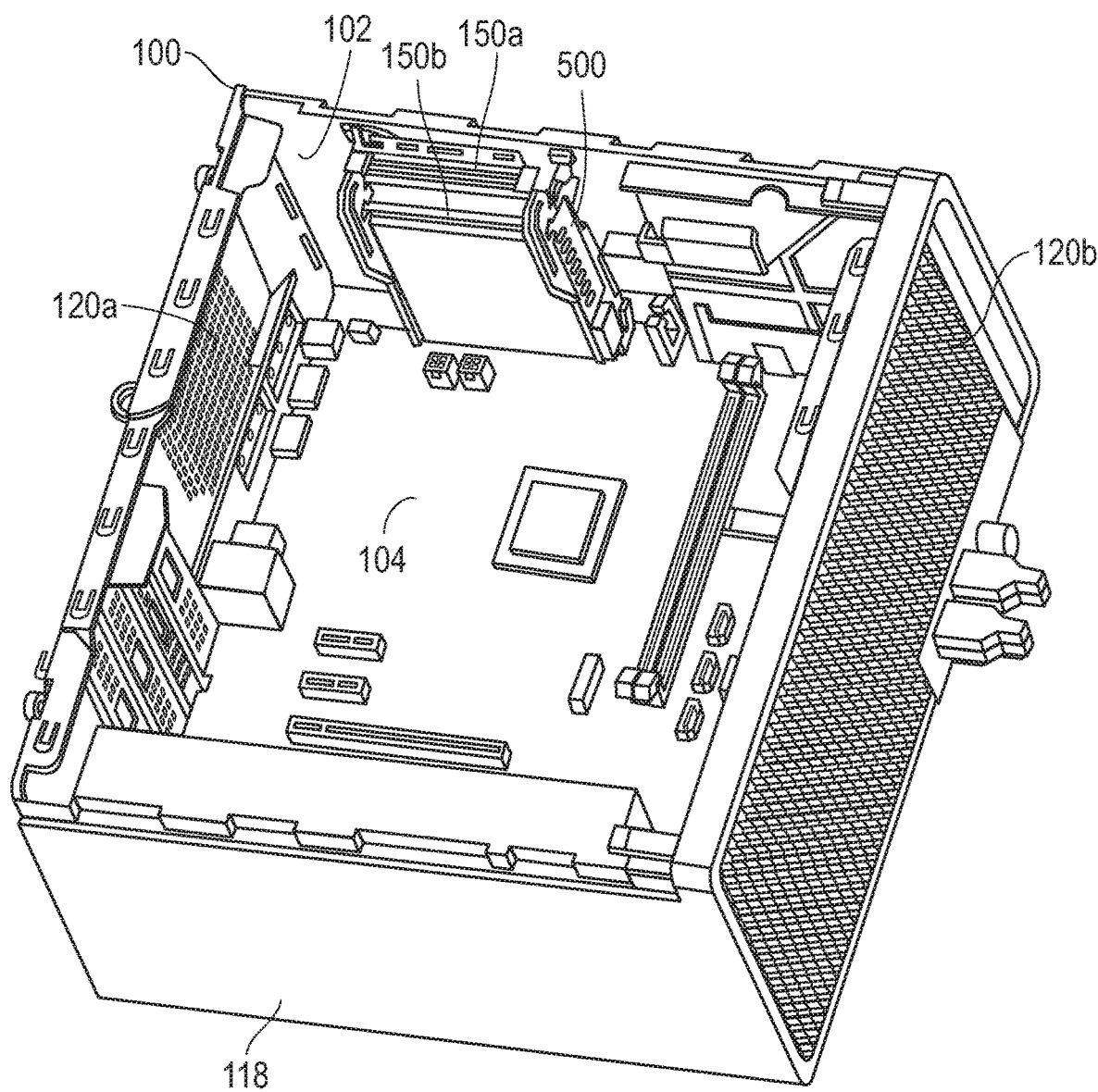
FIG. 1C illustrates a right side perspective view of an information handling system chassis according to one exemplary embodiment of the disclosed systems and methods.

As will be described further herein, drive carrier retaining structural features of FIG. 1A may be utilized to mount and secure either a metal tooled storage drive carrier or plastic tool-less storage drive carrier to (e.g., within) information handling system chassis 100. In this regard, FIG. 1B illustrates a tool-less storage drive carrier (or tool-less drive caddy) 400 mounted to drive carrier retaining structural features of chassis 100 of FIG. 1A, and FIG. 1C illustrates a tooled caddy (or tooled drive caddy) 500 mounted to the same drive carrier retaining structural features of chassis 100 of FIG. 1A. In FIG. 1B tool-less storage drive carrier 400 contains and supports two data storage drives 150a and 150b (e.g., 2.5 inch small form factor HDDs and/or SSDs although 3.5 inch small form factor drives may alternatively be supported), and in FIG. 1C tooled storage drive carrier 500 contains and supports two data storage drives 150a and 150b (e.g., HDDs and/or SSDs). However, it will be understood each of tool-less storage drive carrier 400 and tooled storage drive carrier 150 may alternatively be configured to contain and support a single data storage drive 150, or more than two multiple data storage drives 150. In the illustrated embodiment of FIGS. 1B and 1C, each data storage drive 150a and 150b is oriented with its connection interface (e.g., having data and power connector) adjacent a proximal end of storage drive carrier 400 that is mounted to chassis 100 in position facing the open side of chassis 100 (where cover is removed) in FIGS. 1B and 1C, i.e., to provide user access for connection and disconnection of data connectors (e.g. serial ATA "SATA" or serial-attached SCSI "SAS" interface connectors) and power conductors to data storage drives 150a and 150b.

In one embodiment, each of storage drives 150a and 150b may be a cast metal and/or hard plastic frame defining an enclosure that includes, for example, a hermetically sealed space that contains a drive media (e.g., hard disk, non-volatile Flash memory, etc. as the case may be), and read/write arm (heads) in the case where a storage drive 150 is a hard disk drive. Depending on the type of storage media, each of storage drives 150a and 150b may also include a drive controller PCB assembly 452 including drive controller circuitry, an optional drive motor housing 453, etc.

Figure 2:
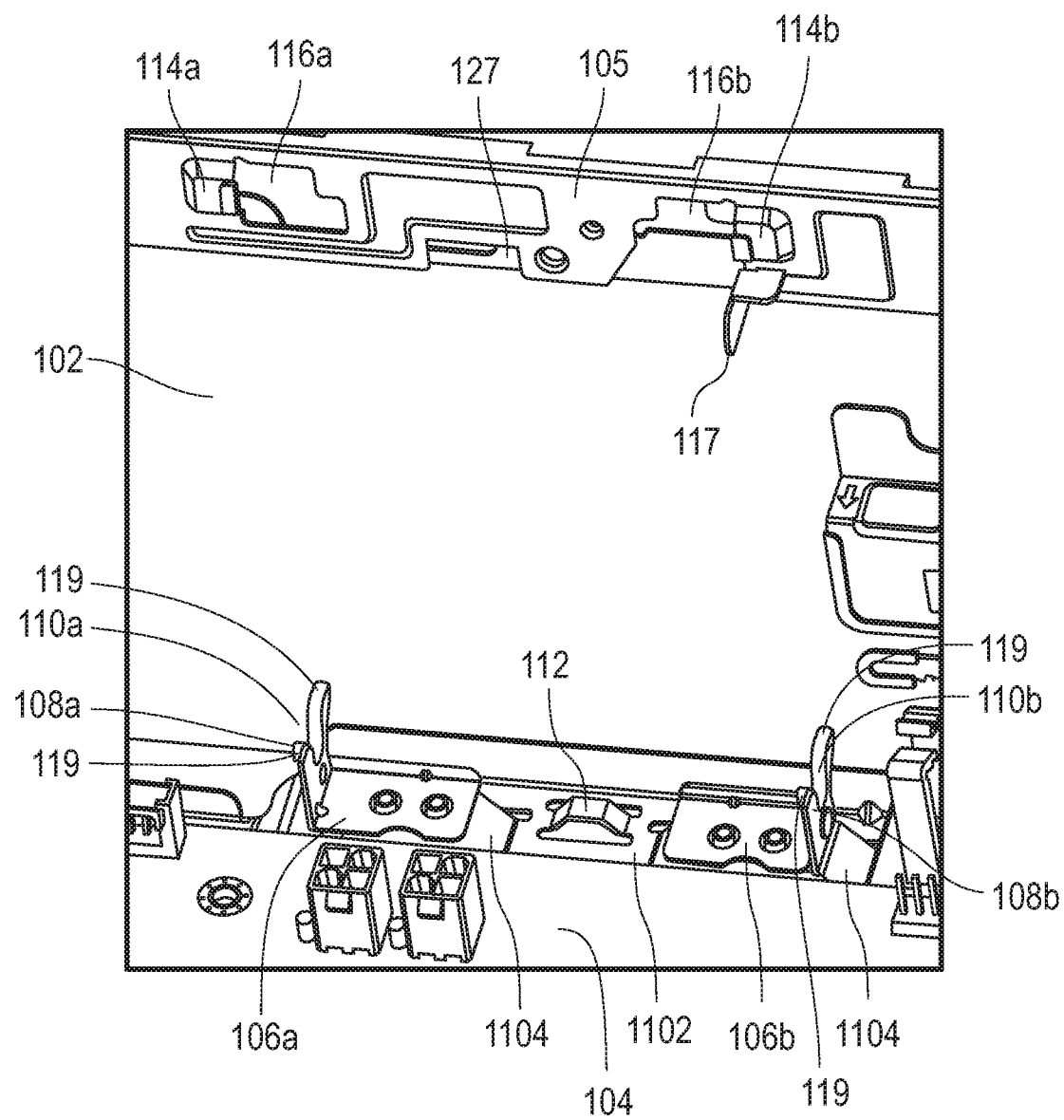
FIG. 2 illustrates an enlarged partial front side perspective view of drive carrier retaining structural features according to one exemplary embodiment of the disclosed systems and methods.

FIG. 2 illustrates an enlarged partial front side perspective view of the drive carrier retaining structural features of chassis 100 of FIG. 1A as they may be provided on or in a substrate 105 of chassis top 102, and on or in a substrate of chassis right side 104 according to one exemplary embodiment. Also visible in FIG. 2 is optional stabilizer 117 and optional integrated retainer risers 1104 that may be provided as sheet meal punch-outs on the substrate of chassis right side 104 to which retainers 108a and 108b (e.g., which may be bent and constructed from no additional cost scrap metal punch out pieces left over from the manufacture of sheet metal of chassis 100) are mechanically coupled by fasteners such as rivets, screws or bolts.

FIG. 3 illustrates an enlarged partial back side perspective view of the drive carrier retaining structural features of chassis 100 of FIG. 1A. Also visible are optional retainer risers 1104 to which retainers 108a and 108b are mechanically coupled to substrate 1102 of chassis right side 104 by fasteners such as rivets, screws or bolts. Risers 1104 may be configured and dimensioned as appropriate to position and space saddles 110a and 110b apart from chassis right side 104 to receive respective pivot pins 404a and 404b of a tool-less storage drive carrier 400 or respective pins 504a and 504b of a tooled storage drive carrier 500 as shown in FIGS. 1B and 1C and as described further herein.

Figure 4:
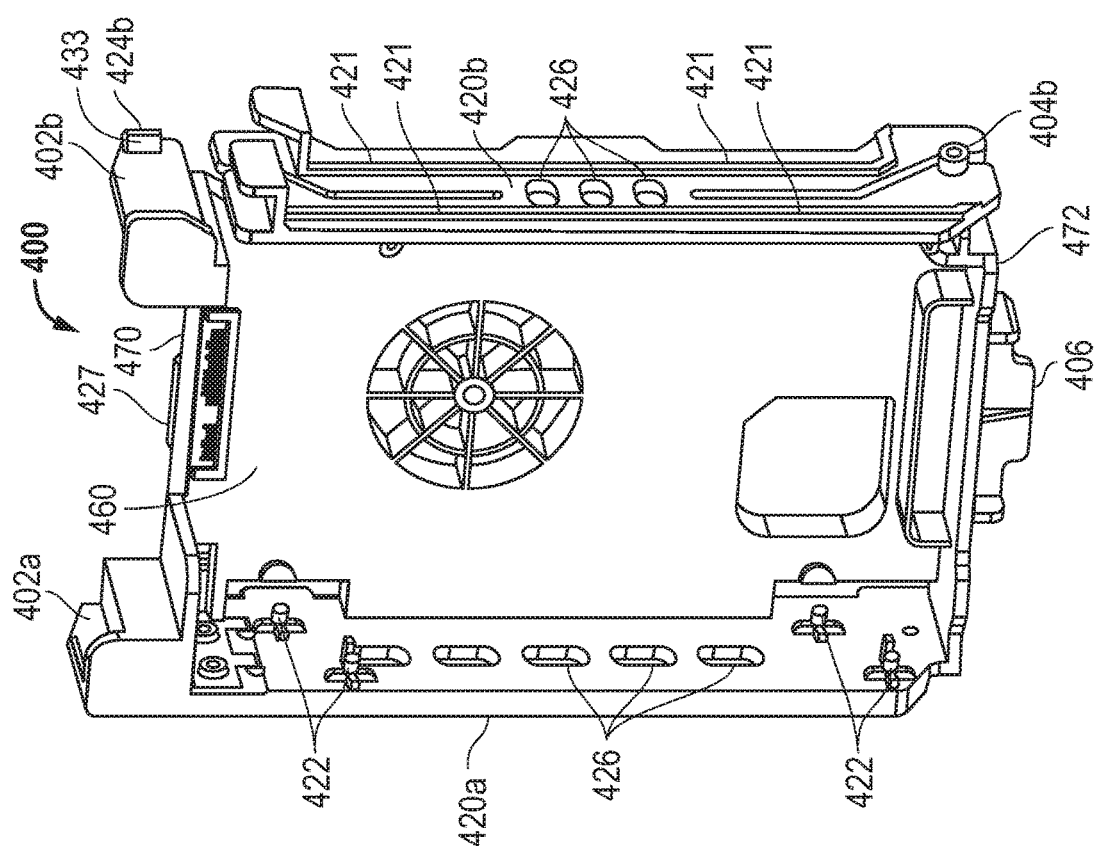
FIG. 4 illustrates a front side perspective view of a tool-less storage drive carrier according to one exemplary embodiment of the disclosed systems and methods.
Figure 6:
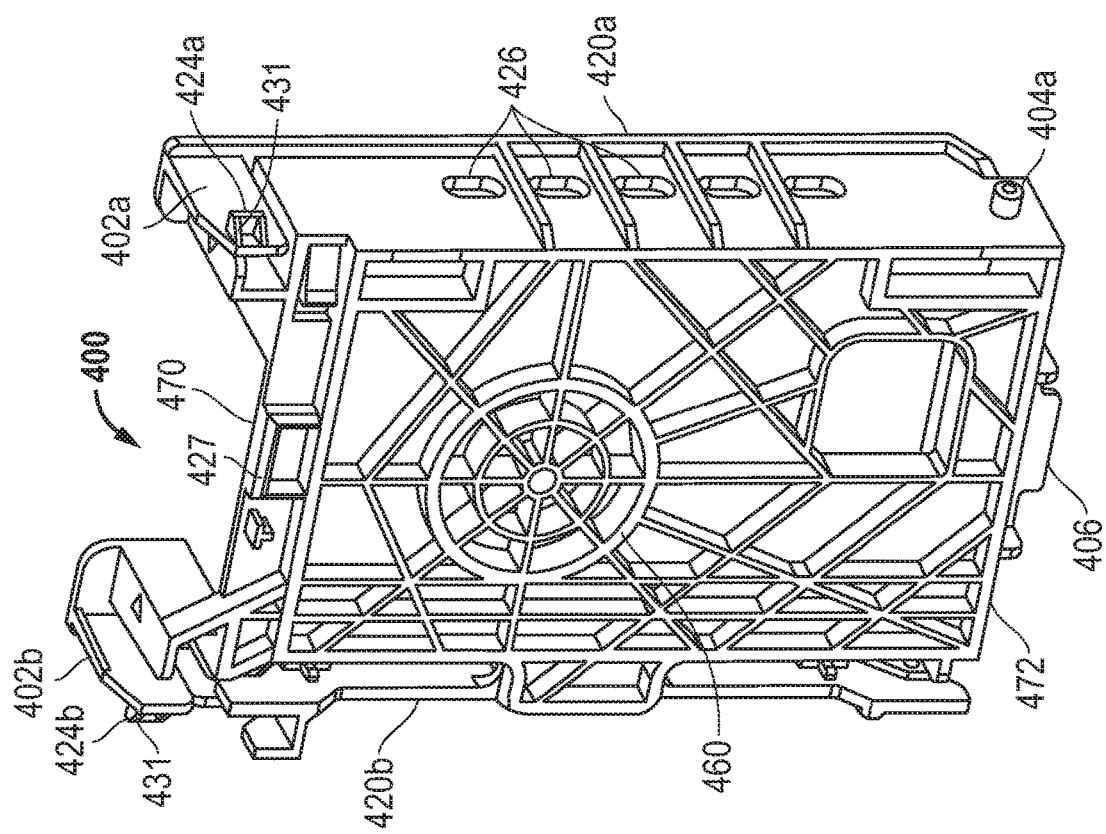
FIG. 6 illustrates a proximal end back side perspective view of a tool-less storage drive carrier according to one exemplary embodiment of the disclosed systems and methods.

FIG. 4 illustrates a front side perspective view of a tool-less storage drive carrier 400 (e.g., a single piece molded plastic component) configured to contain and support two data storage drives 150 according to one exemplary embodiment. FIG. 6 illustrates a back side perspective view of the same tool-less storage drive carrier 400 of FIG. 4. In this embodiment one of storage drive carrier side walls 420a is fixed and the other opposite side wall 402b has four flexible and resilient arms each of which may be bent or otherwise flexed outward to allow one or two data storage drives 150 to be accepted within storage drive carrier 400 in a position against storage drive carrier back wall 460, and both between opposing storage drive carrier side walls 420a and 420b, and opposing storage drive carrier ends 470 and 472.

As shown, tool-less storage drive carrier 400 includes a set of drive engagement pins 422 extending inwardly from the interior surface of sidewall 420a in a pattern configured for insertion into matching mating openings defined in a first outer side of each of two data storage drives 150a and 150b, with another set of drive engagement pins 422 extending inwardly from each of the flexible arms 421 of the interior surface of sidewall 420b (not shown) in a pattern configured for insertion into matching (complimentary-sized and positioned) openings defined in an opposing second side of each of two data storage drives 150a and 150b. In this regard, drive engagement pins 422 of sidewall 420b may bend or otherwise flex outward together with arms 42 of sidewall 420b to provide clearance to position data storage drives 150a and 150b within storage drive carrier 400 and to align the drive engagement pins 422 with the matching openings defined in the sides of the data storage drives 150a and 150b.

Figure 10A:
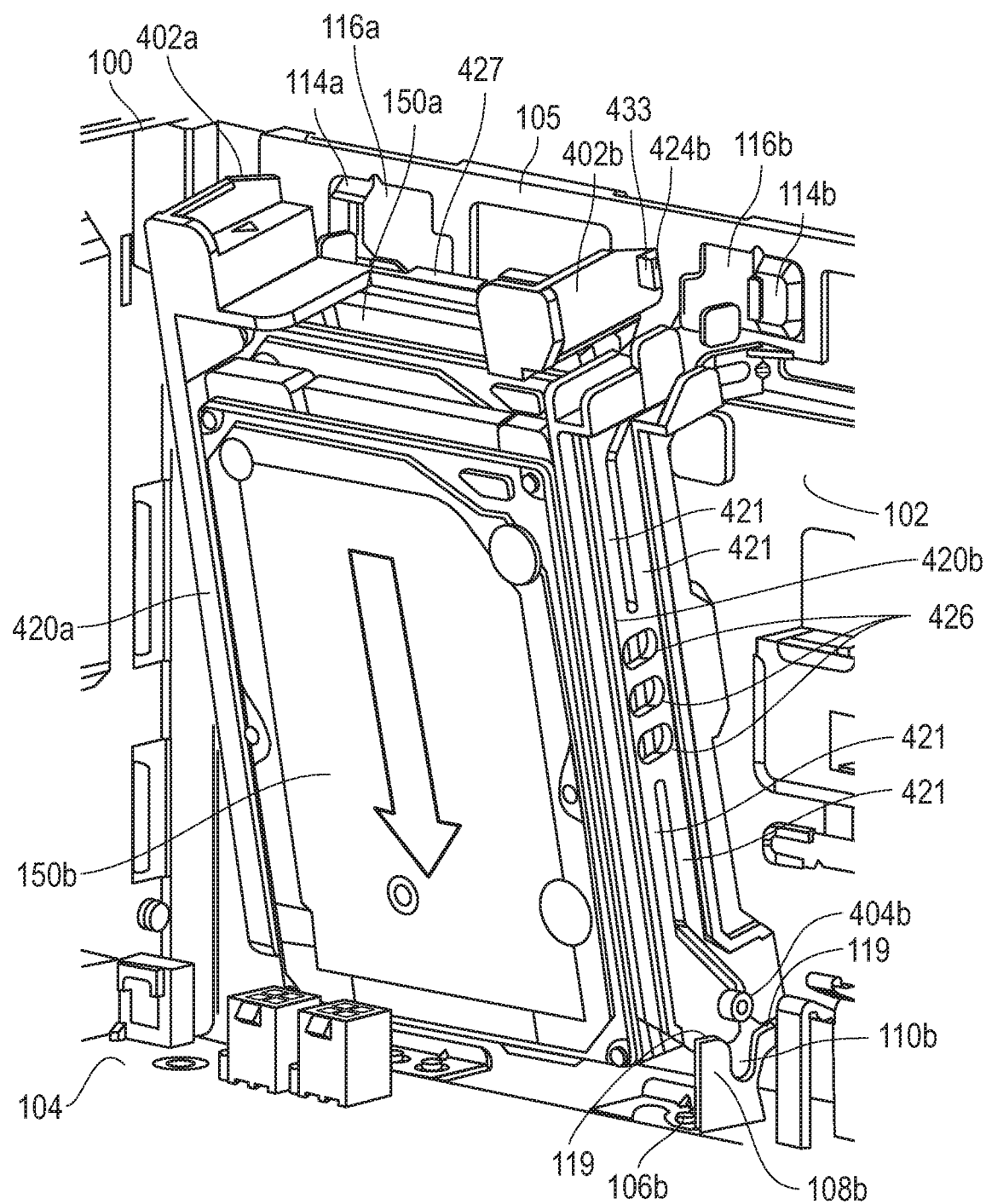
FIG. 10A illustrates a partial perspective view of a tool-less storage drive carrier and information handling system chassis according to one exemplary embodiment of the disclosed systems and methods.
Figure 10B:
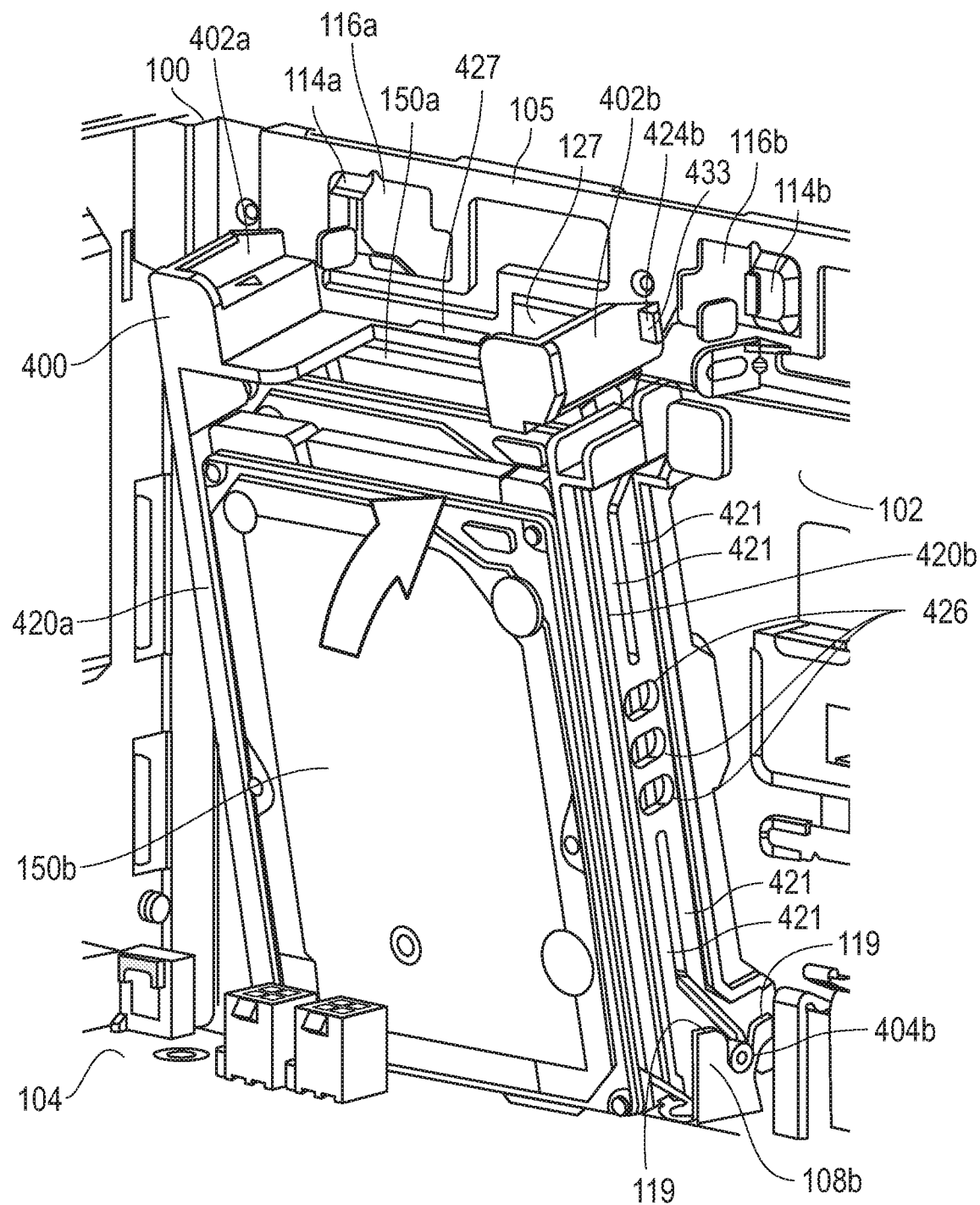
FIG. 10B illustrates a partial perspective view of a tool-less storage drive carrier and information handling system chassis according to one exemplary embodiment of the disclosed systems and methods.
Figure 10C:
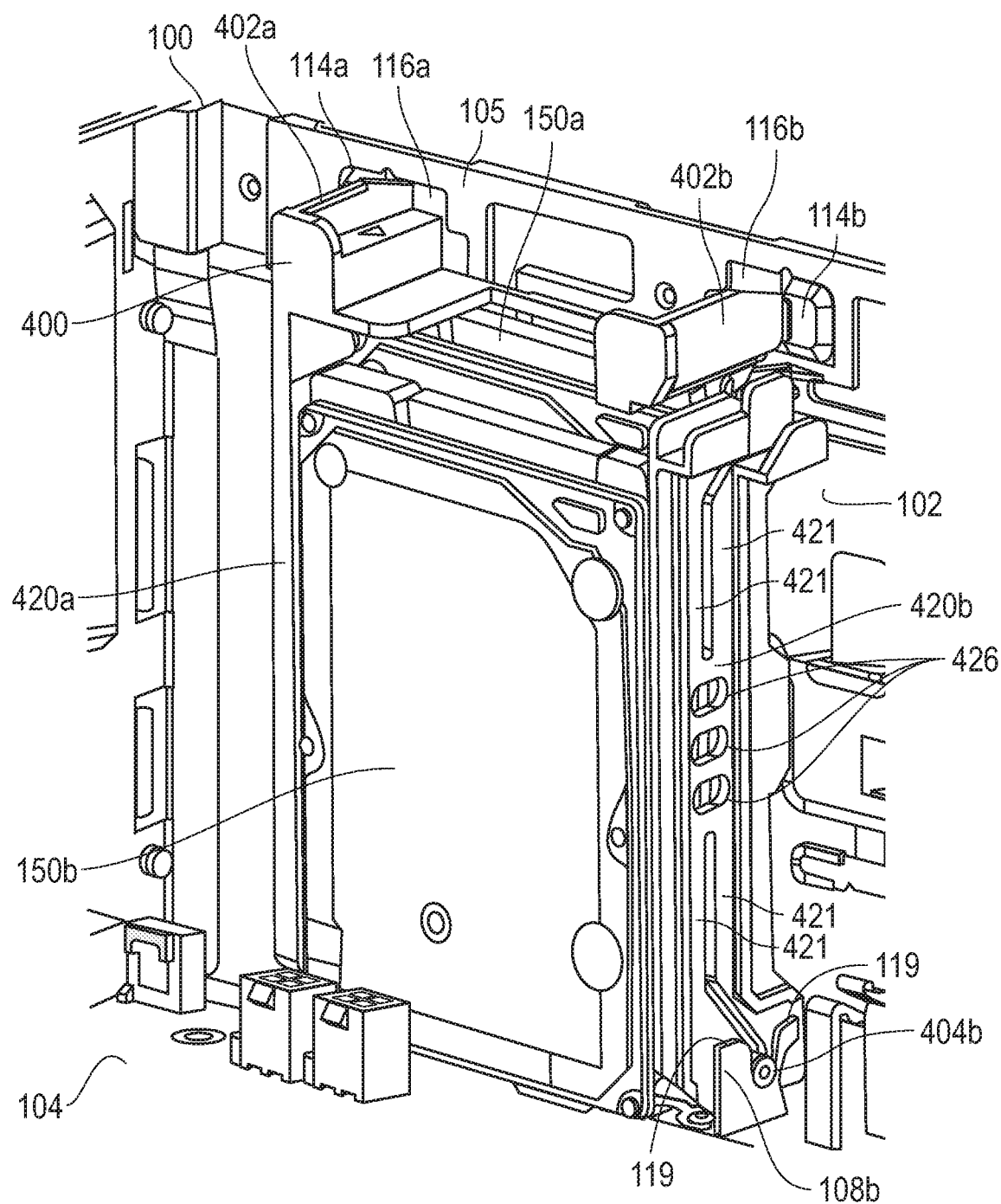
FIG. 10C illustrates a partial perspective view of a tool-less storage drive carrier and information handling system chassis according to one exemplary embodiment of the disclosed systems and methods.

After data storage drives 150a and 150b are positioned within tool-less storage drive carrier 400, flexible arms 421 of sidewall 420b may be released inward to return to a non-flexed state, the action of which moves pins 422 into an inserted position within the respective matching openings defined in the sides of data storage drives 150a and 150b to secure each data storage drive 150a and 150b without requiring tools (e.g., no fasteners such as screws) in a mounted position within the tool-less storage drive carrier 400 as shown in FIGS. 10A to 10C. Cooling openings 426 are defined through both sidewalls 420a and 420b to allow passage of cooling air through openings 426 across a mounted data storage drive 150. Examples of configurations of mated drive caddies and data disk drives may be found described in U.S. Pat. Nos. 9,317,081 and in 9,141,153, each of which is incorporated herein by reference in its entirety for all purposes.

FIGS. 4, 6 and 8 illustrate a configuration of securing features of tool-less storage drive carrier 400 as they may be provided in one embodiment to engage with the storage drive carrier retaining features of chassis 100, e.g., such as they are illustrated and described herein in relation to FIGS. 1A, 2 and 3. In this embodiment, two pivot pins 404a and 404b are provided to extend in opposing outward directions adjacent a distal end of storage drive carrier 400 to define a pivot axis therebetween, and are dimensioned and spaced to be simultaneously received in saddles 110a and 110b of the chassis retention features of chassis 100 in a manner further illustrated in FIGS. 10A and 10B to secure and retain the distal end of storage drive carrier 400 in mounted position to the chassis right side 104. Also shown are two spaced and flexible resilient cantilevered latch arms 402a and 402b extending from the storage drive carrier 400 in a direction perpendicular to the pivot axis and provided on opposite sides of the storage drive carrier 400 adjacent a proximal end of storage drive carrier 400 for securing and retaining the proximal end of storage drive carrier 400 in mounted position to chassis top 102. Each of latch arms 402a and 402b has a profile that is shaped and dimensioned to be inserted and received in a corresponding latch opening 116a and 116b, respectively, as illustrated in FIG. 10C.

In the embodiment of FIGS. 4, 6 and 8, outwardly-facing latches (latch structures) 424a and 424b are formed adjacent the cantilevered distal ends of flexible latch arms 402a and 402b, respectively, as shown. In this embodiment, each latch 424a and 424b extends outward from the outer side of its corresponding latch arm 402 so that it extends beyond the outer periphery of a respective latch opening 116a or 116b when latch arms 402a and 402b are aligned for simultaneous insertion into latch openings 116a and 116b. In this configuration, the distal ends of latch arms 402a and 402b must be bent inward toward each other (in the direction of the arrows in FIG. 8) to provide required clearance to allow latches 424a and 424b to be inserted with latch arms 402 past keepers 114a and 114b into the mounted position shown in FIGS. 10C, 11C and 12A. In this mounted position, latches 424a and 424b are inserted past and clear of respective keepers 114a and 114b so that each of latch arms 402a and 402b are free to relax outwardly and apart from each other to position and bias a flat step surface 433 of each latch 424a and 424b behind a surface of its respective keeper 114a or 114b. This secures and maintains storage drive carrier 400 in position against chassis top 102 by mechanical contact between the step surface of each latch 424 and the structure of keeper 114 as shown in FIG. 12A.

In the particular illustrated embodiment of FIGS. 4, 6 and 8, each latch 424 is shaped to have an optional ramp section 431 and a flat step section 433 that extends outward from its respective latch arm 402 as shown. In this configuration, ramp section 431 of each latch 424 is shaped (e.g., angled) to progressively contact a surface of a corresponding keeper 114 during insertion of tis latch arm 402 into a corresponding latch opening 116, the mechanical contact of which acts to generate a side inward force against the distal end of its cantilevered latch arm 402. During latch arm insertion, this side inward force is simultaneously applied to each of latch arms 402a and 402b, which simultaneously deflects the distal end of latch arms 402a and 402b inward and toward each other in the direction of the arrows shown in FIG. 8. Once step section 433 of each latch arm 402 is inserted past its corresponding keeper 114, the distal end of each latch arm 402 is freed to relax by flexing outward so as to position and trap the step section 433 of each latch 424 behind the back surface of the corresponding keeper 114 as shown in FIG. 12A. In this regard, each latch 424a and 424b may be configured and positioned on latch arms 402 so that the structure of storage drive carrier 400 contacts the chassis top 102 at the same time that latches 424a and 424b are mechanically captured by keepers 114a and 114b to secure storage drive carrier 400 in a mounted position against chassis top 102.

Although this embodiment includes a combination of two latch arms 402, two latches 424, two latch openings 116, and two keepers 114 to secure a tool-less storage drive carrier 400 to a chassis 100, other combinations are possible in other embodiments. For example, a tool-less storage drive carrier 400 may employ a combination of a single latch arm 402 having a single latch 424 (e.g., provided on a single side of storage drive carrier 400) together with a mating single latch opening 116 and single keeper 114 of a chassis 100 to secure the storage drive carrier 400 to the chassis 100.

e.g., including an embodiment using a combination of a single latch arm 402, single latch 424, single latch opening 116 and single keeper 114 to secure a storage drive carrier 400 to a chassis 100; and another embodiment using a combination of three or more latch arms 402, three or more latches 424, three or more openings 116, and three or more keepers 114 to secure a storage drive carrier 400 to a chassis 100.

As further shown in FIGS. 4, 6 and 8, a storage drive carrier 400 may be optionally provided with one or more additional securing features to further stabilize the mounting of the storage drive carrier 400 to a chassis 100. Examples of such additional securing features include preload antivibration tab 406 extending from the center of a distal end of storage drive carrier 400, and/or engagement key 427 that extends outward from the back side of storage drive carrier 400 adjacent and between latch arms 402a and 402b. As described further herein, key 427 may be complimentary dimensioned and shaped so as to be closely received (with small clearance) in key opening (e.g., slot or other shape of opening) 127 of chassis top 102 when storage drive carrier 400 is mounted to chassis 100. In this received position, mechanical contact between key 427 and inner surfaces defining key opening 127 prevents lateral (side-to-side) movement of the proximal end of mounted storage drive carrier 400 relative to chassis top 102. Tab 406 may be dimensioned and positioned to mechanically contact and at least partially depress resilient preload protrusion 112 of chassis 100 when storage drive carrier 400 is mounted to chassis 100. The resilient contact between tab 406 and protrusion 112 acts to dampen any vibration and noise propagation originating from a motor or other moving parts (e.g., such as of a spinning HDD) contained inside a data storage drive 150 that itself is mounted within storage drive carrier 400.

FIGS. 10A, 10B and 10C and corresponding FIGS. 11A, 11B and 11C illustrate one exemplary sequence of method steps for mounting storage drive carrier 400 into position with chassis 100 in accordance with the embodiment of FIGS. 4, 6, 8 and 12A described above. As illustrated in FIGS. 10A, 10B and 10C, data storage drives 150a and 150b may be installed and mounted within storage drive carrier 400, before mounting storage drive carrier 400 to chassis 100. Although mounting step sequence for a tool-less storage drive carrier 400 is illustrated, it will be understood that the same mounting step methodology may be employed for mounting a tooled storage drive carrier 500 such as illustrated and described further herein.

FIGS. 10A and 11A illustrate an initial step in which storage drive carrier 400 is first positioned adjacent and between chassis right side 104 and chassis top 102, with pivot pins 404a and 404b aligned for insertion into respective saddles 110a and 110b of chassis right side 104. As shown in FIGS. 10A and 11A, the distal end of storage drive carrier 400 (with pivot pins 404) is initially positioned closer to chassis top 102 than is the proximal end of storage drive carrier 400 (with latch arms 402). At this time, the distal end of storage drive carrier 400 is moved toward chassis right side 104 in the direction of the arrows in FIGS. 10A and 11A to bring distal end of storage drive carrier 400 closer to chassis right side 104 and thus cause insertion of pivot pins 404a and 404b into respective saddles 110a and 110b of chassis right side 104 as shown in FIGS. 10B and 11B.

Figure 13A:
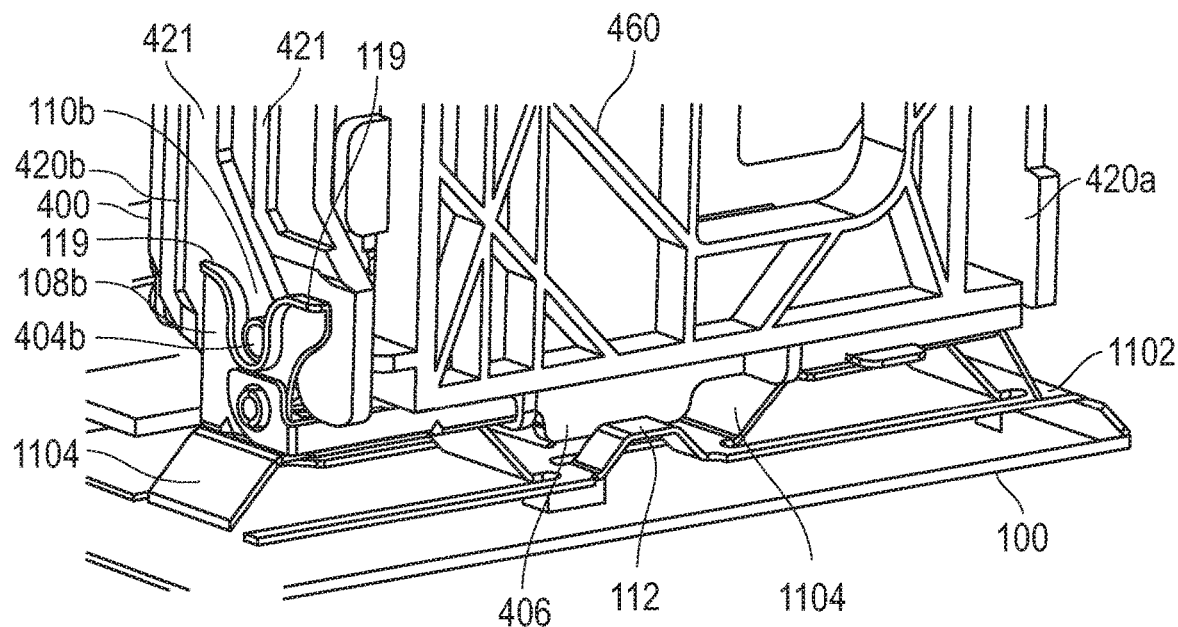
FIG. 13A illustrates a partial back side perspective view of a distal end of a tool-less storage drive carrier mounted to an information handling system chassis according to one exemplary embodiment of the disclosed systems and methods.
Figure 13B:
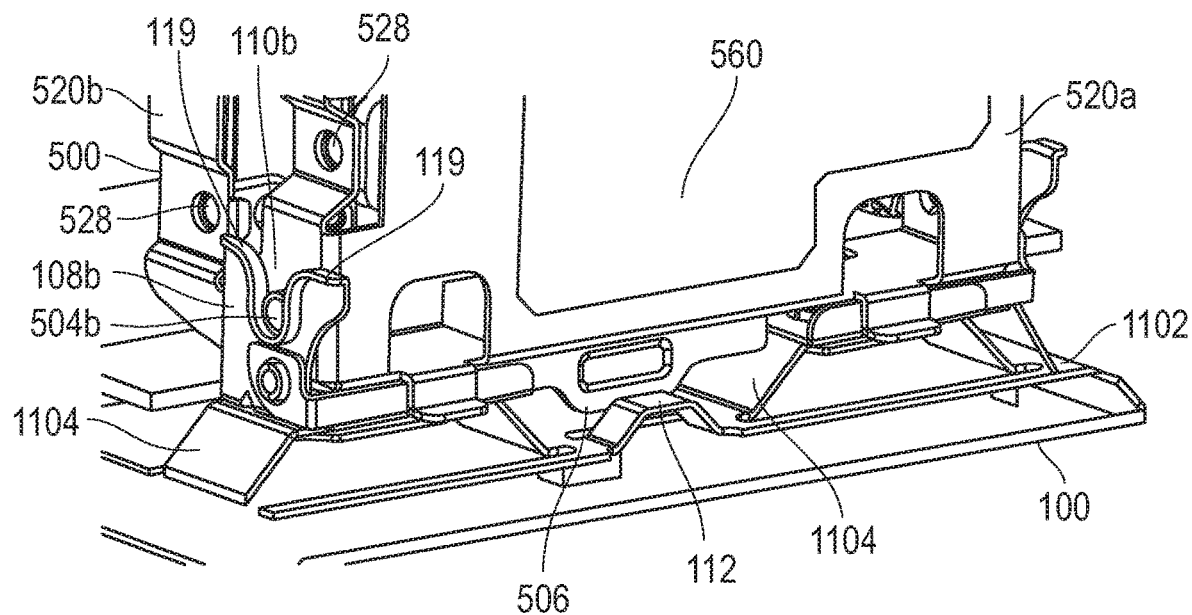
FIG. 13B illustrates a partial back side perspective view of a distal end of a tooled storage drive carrier mounted to an information handling system chassis according to one exemplary embodiment of the disclosed systems and methods.
Figure 14:
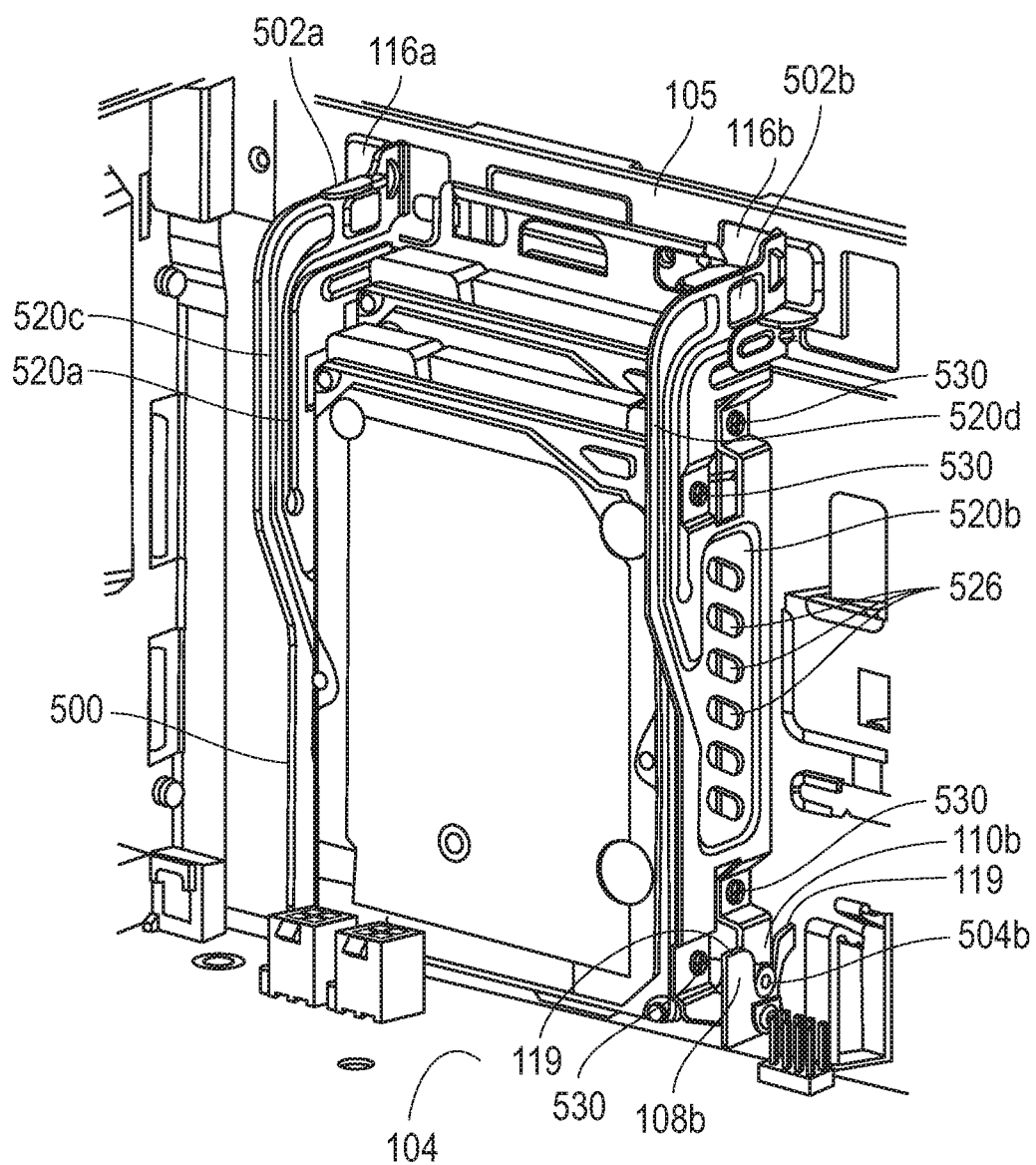
FIG. 14 illustrates a partial front side perspective view of a tooled storage drive carrier mounted to an information handling system chassis according to one exemplary embodiment of the disclosed systems and methods.
Figure 15B:
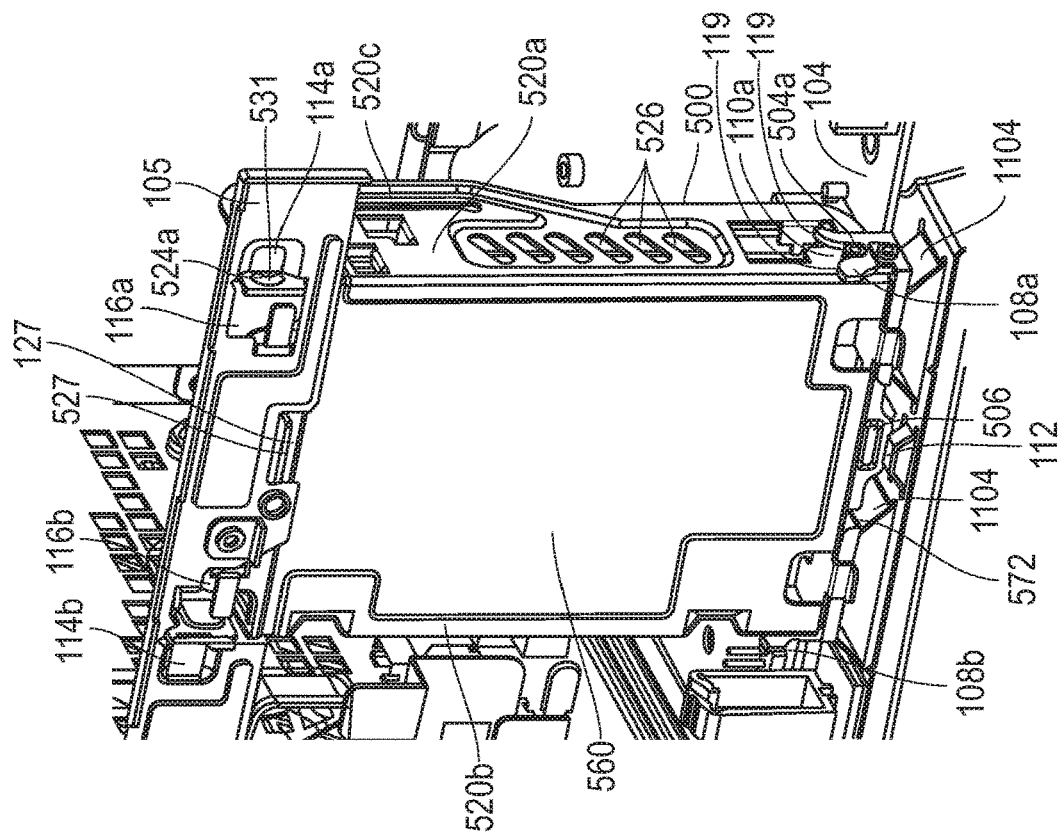
FIG. 15B illustrates a partial back side perspective view of a tooled storage drive carrier mounted to an information handling system chassis according to one exemplary embodiment of the disclosed systems and methods.
Figure 15A:
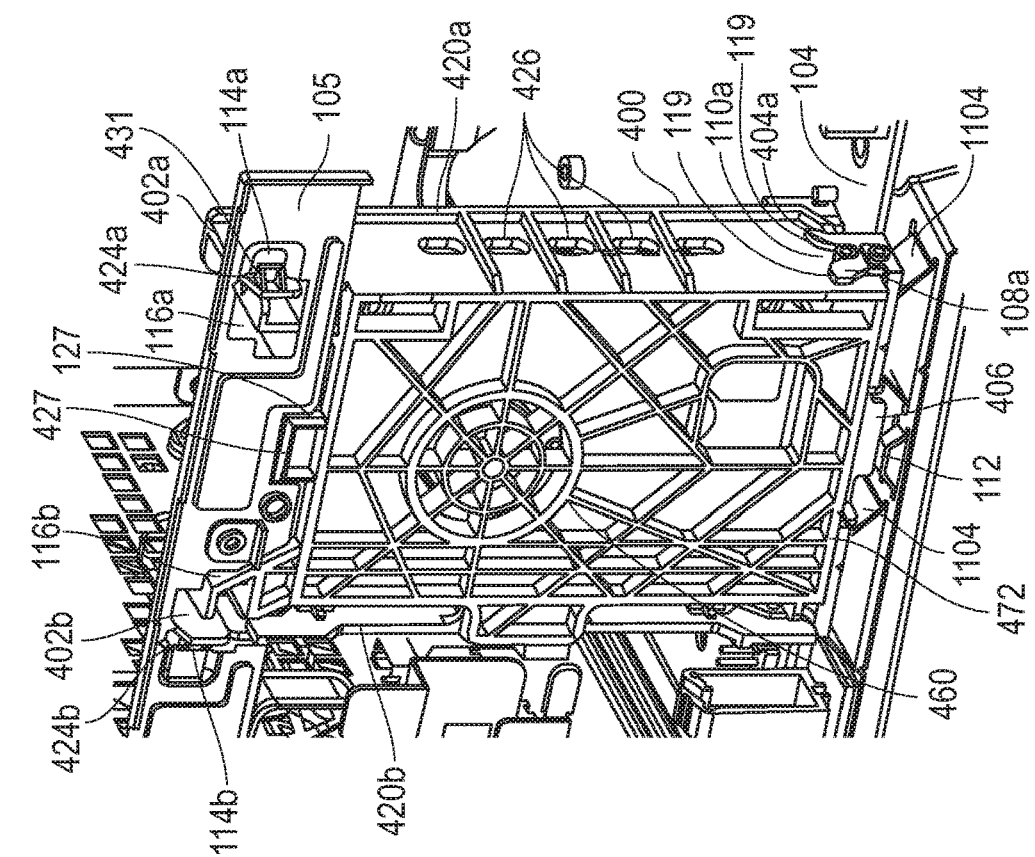
FIG. 15A illustrates a partial back side perspective view of a tool-less storage drive carrier mounted to an information handling system chassis according to one exemplary embodiment of the disclosed systems and methods.

As shown in FIGS. 10B and 11B, insertion of pivot pins 404a and 404b into respective saddles 110a and 110b brings latch arms 402a and 402b into aligned positions ready for simultaneous insertion into respective latch opening 116a and 116b of chassis top 102. The proximal end of storage drive carrier 400 may then be pivoted toward chassis top 102 about pivot pins 404a and 404b in the direction of the arrows in FIGS. 10B and 11B to cause simultaneous insertion of latch arms 402a and 402b into latch openings 116a and 116b as shown in FIGS. 10C and 11C. The same pivoting action of storage drive carrier 400 also causes optional key 427 to be simultaneously received in key opening 127 of chassis top 102 as illustrated in FIG. 15A and as previously described. As shown in FIG. 13A, storage drive carrier 400 may be configured such that optional preload anti-vibration tab 406 of storage drive carrier 400 mechanically contacts and at least partially depresses resilient preload protrusion 112 of chassis 100 in the manner previously described when storage drive carrier 400 is mounted to chassis 100 with pivot pins 404a and 404b inserted and seated within respective saddles 110a and 110b.

During insertion of latch arms 402a and 402b into respective latch openings 116a and 116b, each ramp section 431 of its respective latch 424 progressively contacts and mechanically contacts with a surface of a corresponding keeper 114 to generate a side inward force against the distal end of its respective cantilevered latch arm 402, which deflects each of the latch arms 402a and 402b inward toward each other during the insertion action in the manner previously described and illustrated by arrows in FIG. 8. In one embodiment, this simultaneous insertion of flexible latch arms 402a and 402b into latch openings 116a and 116b continues until the ramp section 431 and step section 433 of each of latches 424a and 424b is fully inserted past surfaces of latches 424a and 424b, respectively, as shown in FIGS. 10C, 11C and 12A. At this point, inwardly-bent latch arms 402a and 402b is freed to flex outward such that the latch 424 of each latch arm 402a and 402b is mechanically captured behind the back surface of its corresponding keeper 114 as shown in FIGS. 10C, 11C and 12A, which acts to provide mechanical contact between the step surface 433 of each latch 424 and the structure of keeper 114 to secure storage drive carrier 400 against chassis top 102 in a mounted position within chassis 100 as shown in FIG. 12A. At the same time, each of pivot pins 404a and 404b are tightly received (with small clearance) within a complimentary-sized saddle opening 110a or 110b to hold storage drive carrier 400 in stable stationary position relative to chassis right side 104 by mechanical contact between the each pivot pin 404 and its respective saddle opening 110.

In another embodiment, a tooled storage drive carrier 500 may be provided with securing features for engaging with the same previously-described drive carrier retaining structural features of chassis 100, e.g., as described herein in relation to FIGS. 1A, 2 and 3. Such a tooled storage drive carrier 500 may be constructed of sheet metal (e.g., such as a sheet of steel, aluminum, alloys thereof, etc.) that has been tooled (e.g., by punching and/or stamping) to form the structure and features of storage drive carrier 500.

Figure 5:
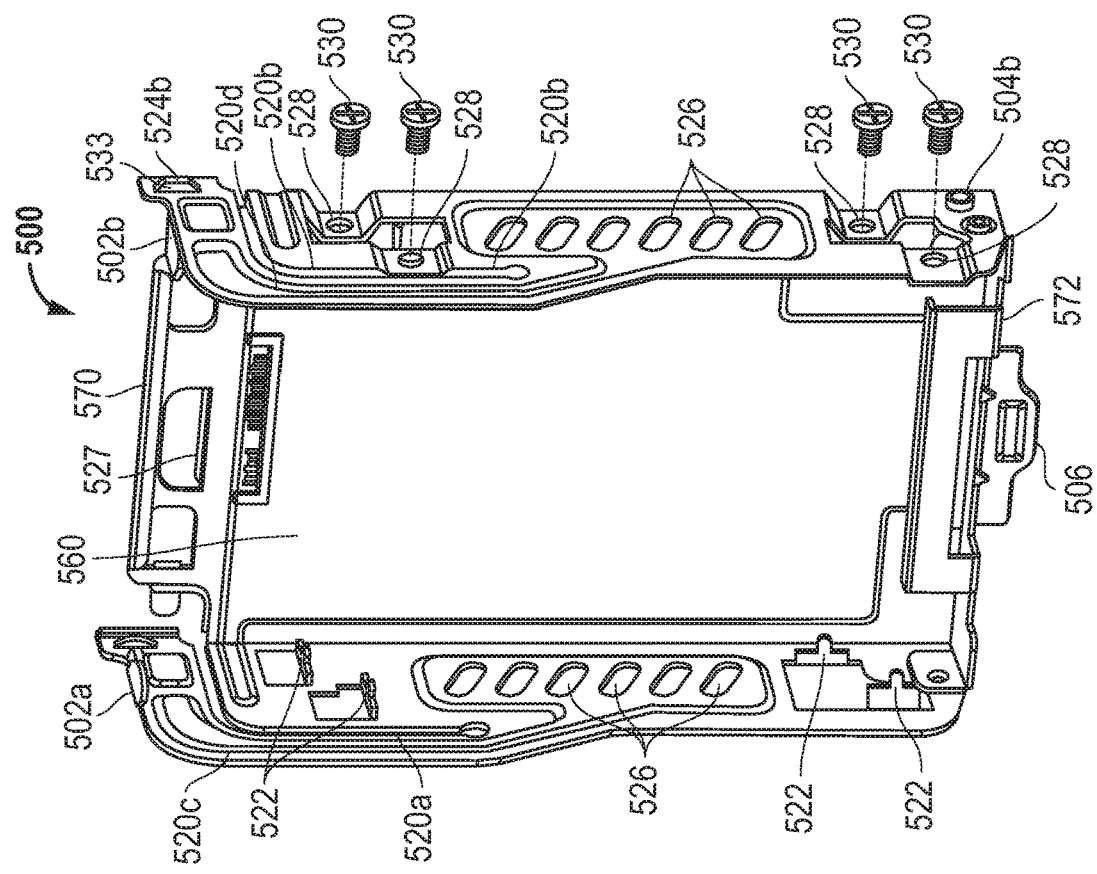
FIG. 5 illustrates a front side perspective view of a tooled storage drive carrier according to one exemplary embodiment of the disclosed systems and methods.
Figure 7:
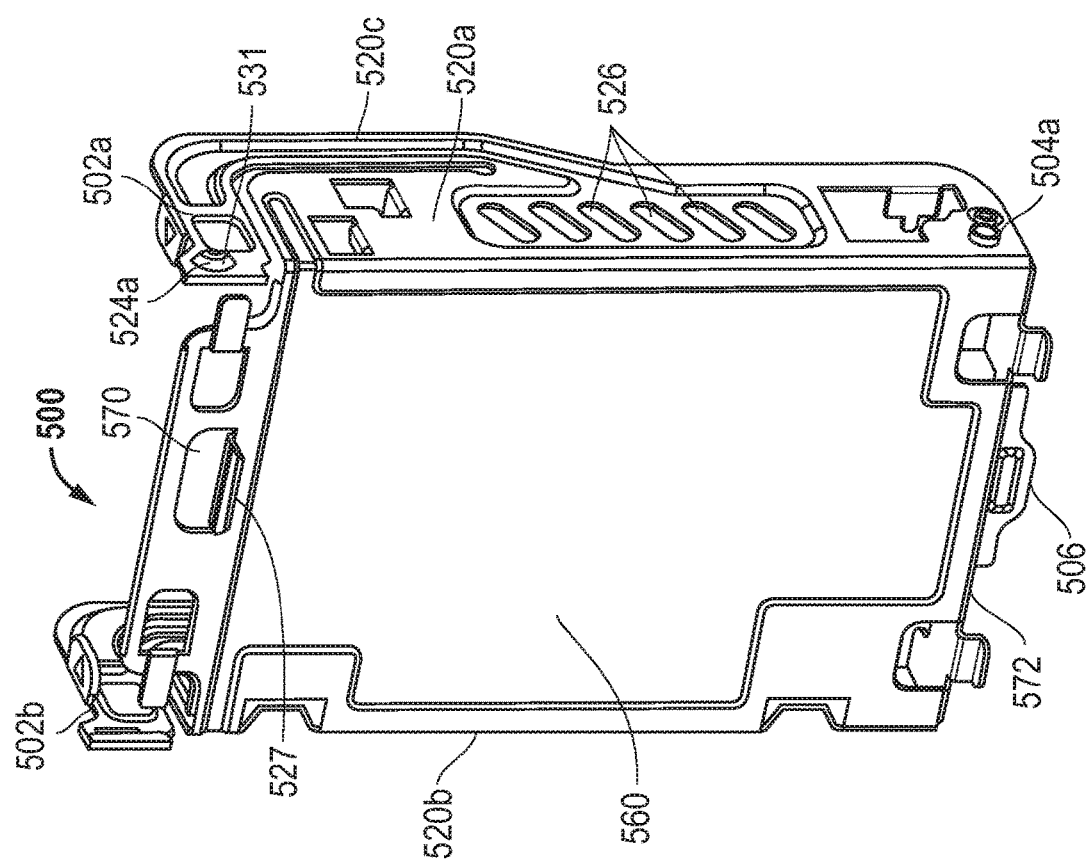
FIG. 7 illustrates a proximal end back side perspective view of a tooled storage drive carrier according to one exemplary embodiment of the disclosed systems and methods.

FIGS. 5, 7 and 9 illustrate different views of one embodiment of a tooled storage drive carrier 500 that is provided with a configuration of securing features that correspond in function and position to the previously-described securing features of tool-less cavity 400. In this regard, two pivot pins 504a and 504b are provided to extend in opposing outward directions adjacent a distal end of storage drive carrier 500 to define a pivot axis therebetween, and are dimensioned and spaced to be simultaneously received in saddles 110a and 110b of the chassis retention features of chassis 100 in a similar manner as pivot pins 404a and 404b of tool-less storage drive carrier 400. Two spaced and flexible resilient cantilevered latch arms 502a and 502b are provided adjacent a proximal end of storage drive carrier 500 and each extend from the storage drive carrier 500 in a direction perpendicular to the pivot axis, with each having a profile that is shaped and dimensioned to be inserted and received in a corresponding latch opening 116a and 116 of chassis 100 in a similar manner to latch arms 402a and 402b of storage drive carrier 400. As shown, latch arm 502a is formed as a perpendicular extension from flexible side section 520c of storage drive carrier sidewall 520a, and latch arm 502b is formed as a perpendicular extension from flexible side section 520d of storage drive carrier sidewall 520b. In one embodiment, flexible side sections 520c and 520d may be present to provide additional flexibility and range of sideways displacement for sheet metal latch arms 502a and 502b.

Similar to latches 424 of storage drive carrier 400, outwardly-facing latches (latch structures) 524a and 524b are formed adjacent the cantilevered distal ends of respective flexible latch arms 502a and 502b of storage drive carrier 500. In the illustrated embodiment of FIGS. 5, 7 and 9, each latches 524a and 524b extends outward from the outer side of its corresponding latch arm 502 so that it extends beyond the outer periphery of a respective latch opening 116a or 116b of chassis 100 when latch arms 502a and 502b are aligned for simultaneous insertion into latch openings 116a and 116b. Similar to latch arms 424 of tool-less storage drive carrier 400, the distal ends of latch arms 502a and 502b must be bent inward toward each other (in the direction of the arrows in FIG. 9) to provide required clearance to allow latches 524a and 524b to be inserted with latch arms 502 past keepers 114a and 114b into the mounted position shown in FIG. 12B.

In the particular illustrated embodiment of FIGS. 5, 7 and 9, each latch 524 is shaped to have an optional ramp section 531 and an arcuate or rounded step section 533 that extends outward from its respective latch arm 502 in similar manner to ramp 431 and step section 433 of tool-less storage drive carrier 400 as shown. In this configuration, ramp section 531 of each latch 524 is shaped (e.g., angled) to progressively contact a surface of a corresponding keeper 114 during insertion of its latch arm 502 into a corresponding latch opening 116, the mechanical contact of which acts to generate a side inward force against the distal end of its cantilevered latch arm 502 in similar manner as described for latch arms 402 of tool-less storage drive carrier 400. In the mounted position of FIG. 12B, latches 524a and 524b are inserted past and clear of respective keepers 114a and 114b so that each of latch arms 502a and 502b are free to relax apart from each other to position an arcuate or rounded step surface 533 of each latch 524a and 524b behind a surface of its respective keeper 114a or 114b. This secures and maintains storage drive carrier 500 in position against chassis top 102 by mechanical contact between the step surface of each latch 524 and the structure of keeper 114 as shown in FIG. 12B. At the same time, each of pivot pins 504a and 504b are tightly received (with small clearance) within a complimentary sized saddle opening 110a or 110b to hold storage drive carrier 500 in stable stationary position relative to chassis right side 104 by mechanical contact between the each pivot pin 504 and its respective saddle opening 110.

It will be understood that the shape and configuration of a latch 424 or 524 may vary, for example, a latch 424 may be provided with an arcuate or rounded step surface similar to step surface 533, and a latch 524 may be provided with a flat (non-rounded) step surface similar to step surface 433. Further, other shapes and configurations are possible to provide the indicated function of step surfaces 433 and 533 as described herein.

Similar to storage drive carrier 400, side inward force is simultaneously applied to each of latch arms 502a and 502b during latch arm insertion of a tooled storage drive carrier 500, which simultaneously deflects the distal end of latch arms 502a and 502b inward and toward each other in the direction of the arrows shown in FIG. 9. Once step section 533 of each latch arm 502 is inserted past its corresponding keeper 114, the distal end of each latch arm 502 is freed to relax by flexing outward so as to position and trap the step section 533 of each latch 524 behind the back surface of the corresponding keeper 114 as shown in FIG. 12A. In this regard, each latch 524*a* and 524*b* may be configured and positioned on latch arms 502 so that the structure of storage drive carrier 500 contacts the chassis top 102 at the same time that latches 524*a* and 524*b* are mechanically captured by keepers 114*a* and 114*b* to secure storage drive carrier 500 in a mounted position against chassis top 102.

Similar to tool-less storage drive carrier 400, other embodiments of a tooled storage drive carrier 500 may employ a combination of a single latch arm 502 having a single latch 524 (e.g., provided on single side of storage drive carrier 500) together with a mating single latch opening 116 and single keeper 114 of a chassis 100 to secure the storage drive carrier 500 to the chassis 100.

As further shown in FIGS. 5, 7 and 9, a tooled storage drive carrier 500 may be optionally provided with one or more additional securing features to further stabilize the mounting of the storage drive carrier 500 to a chassis 100. These additional securing features may be positioned and configured to function in similar manner to corresponding additional securing features previously described for tool-less storage drive carrier 400. In this regard, tooled storage drive carrier 500 may be provided with a preload anti-vibration tab 506 extending from the center of a distal end of storage drive carrier 500, and/or an engagement key 527 that extends outward from the back side of storage drive carrier 500 adjacent and between latch arms 502*a* and 502*b*. In a manner similar to that previously described for engagement key 427 of tool-less storage drive carrier 400, key 527 may be complimentary dimensioned and shaped so as to be closely received (with small clearance) in key opening 127 of chassis top 102 when storage drive carrier 500 is mounted to chassis 100. In this received position, mechanical contact between key 527 and inner surfaces defining key opening 127 prevents lateral (side-to-side) movement of the proximal end of mounted storage drive carrier 500 relative to chassis top 102. Tab 506 may be dimensioned and positioned to mechanically contact and at least partially depress resilient preload protrusion 112 of chassis 100 when storage drive carrier 500 is mounted to chassis 100 in manner similar to tab 406 of tool-less storage drive carrier 400, i.e., so that the resilient contact between tab 506 and protrusion 112 acts to dampen any vibration originating from a motor or other moving parts contained inside a data storage drive 150 that itself is mounted within storage drive carrier 500.

As shown in FIG. 5, a tooled storage drive carrier 500 may include a set of drive engagement pins 522 extending inwardly from the interior surface of storage drive carrier sidewall 520*a* in a pattern configured for insertion into matching openings defined in a first outer side of each of two data storage drives 150*a* and 150*b*. As shown in FIGS. 5 and 9, openings 528 may be defined in the opposing storage drive carrier sidewall 520*b* of the same tooled storage drive carrier 500 for receiving threaded fasteners 530 to secure a second outer side of data storage drives 150*a* and 150*b* within tooled storage drive carrier 500. In this regard, a pattern and number of openings 528 may be defiend to correspond the locations of internally-threaded mounted holes of data storage drives 150*a* and 150*b* when they are received within tooled storage drive carrier 500. As further shown, cooling openings 526 may be defined through both storage drive carrier sidewalls 520*a* and 520*b* to allow passage of cooling air through openings 526 across a mounted data storage drive 150. Examples of configurations of mated drive caddies and data disk drives may be found described in U.S. Pat. Nos. 9,317,081 and in 9,141,153, each of which is incorporated herein by reference in its entirety for all purposes.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A system, comprising:
a chassis having at least one keeper and first and second retainers, the first and second retainers being spaced apart to receive a storage drive carrier between the first and second retainer;
where a first opening is defined in the first retainer and a second opening is defined in the second retainer, the first opening being configured to receive a first pin extending outward from a first side of the storage drive carrier at the same time that the second opening receives a second pin extending outward from an opposite second side of the storage drive carrier; and
where the keeper is configured to engage a latch having a profile defined by a ramp and a step supported on a flexible arm extending from the storage drive carrier with the keeper engaging the step of the latch at the same time that the first and second pins are received by the respective first and second openings and with the flexible arm biasing the latch to maintain the step of the latch engaged by the keeper to mechanically secure the storage drive carrier to the chassis.

2. The system of claim 1, further comprising the storage drive carrier mechanically secured to the chassis between the first and second retainers with the first pin of the storage drive carrier received in the first opening of the chassis, the second pin of the storage drive carrier received in the second opening of the chassis and defining a pivot axis with the first pin, and the keeper of the chassis extending in a direction perpendicular to the pivot axis to receive the latch and engage the step of the storage drive carrier.

3. The system of claim 2, where the chassis further comprises at least one stabilizer contacting at least one side of the secured storage drive carrier and preventing freedom of movement of the secured storage drive carrier relative to the chassis.

4. The system of claim 1, where the first and second retainers are spaced apart to interchangeably receive either a plastic tool-less storage drive carrier or a sheet metal tooled storage drive carrier between the first and second retainers with the first opening receiving the first pin extending outward from the first side of either the tool-less or tooled storage drive carrier at the same time that the second opening receives the second pin extending outward from the opposite second side of the tool-less or tooled storage drive carrier, and with the keeper engaging the latch extending from either the tool-less or tooled storage drive carrier with the flexible arm biasing the latch to maintain the step of the latch engaged by the keeper at the same time that the first and second pins are received by the respective first and second openings to mechanically secure either the tool-less or tooled storage drive carrier to the chassis.

5. A system, comprising:
a chassis having at least one keeper and first and second retainers, the first and second retainers being spaced apart to receive a storage drive carrier between the first and second retainers,
where a first opening is defined in the first retainer and a second opening is defined in the second retainer, the first opening being configured to receive a first pin extending outward from a first side of the storage drive carrier at the same time that the second opening receives a second pin extending outward from an opposite second side of the storage drive carrier, and
where the keeper is configured to engage a latch extending from the storage drive carrier at the same time that the first and second pins are received by the respective first and second openings to mechanically secure the storage drive carrier to the chassis; and
further comprising the storage drive carrier mechanically secured to the chassis between the first and second retainers with the first pin of the storage drive carrier received in the first opening of the chassis, the second pin of the storage drive carrier received in the second opening of the chassis and defining a pivot axis with the first pin, and the keeper of the chassis extending in a direction perpendicular to the pivot axis to engage the latch of the storage drive carrier;
where the storage drive carrier further comprises first and second latches and has opposing proximal and distal ends, each of the first and second sides of the storage drive carrier extending from the proximal end of the storage drive carrier to the distal end of the storage drive carrier; where the storage drive carrier further comprises first and second arms extending from the storage drive carrier adjacent the proximal end of the storage drive carrier, a distal end of the first arm supporting the first latch and a distal end of the second arm supporting the second latch; where the first pin and the second pin extend outward from the respective first and second sides of the storage drive carrier adjacent the distal end of the storage drive carrier; and where the chassis comprises a first keeper engaging the first latch and a second keeper engaging the second latch with the first and second pins of the storage drive carrier received by the respective first and second openings of the chassis to mechanically secure the storage drive carrier to the chassis.

6. The system of claim 5, further comprising at least one data storage drive received within and mounted to the storage drive carrier.

7. The system of claim 5, where the first and second latches each have a profile defined by a ramp and a step that is engaged by a respective one of the first and second keepers to secure the storage drive carrier to the chassis; where each of the first and second arms are flexible between a first position in which the step of its latch is not engaged by a respective one of the first and second keepers and a second position in which the step of its latch is engaged by the respective one of the first and second keepers; and where each of the flexible first and second arms biases its respective first or second latch toward the second position to maintain its respective step engaged by the respective one of the first and second keepers.

8. The system of claim 7, where the chassis further comprises a first substrate, the first keeper and the second keeper provided on the first substrate with a first opening defined in the first substrate adjacent and contiguous with the first keeper, and a second opening defined in the first substrate adjacent and continuous with the second keeper; where the first arm is received by the first opening with the first keeper engaging the step of the first latch and where the second arm is received by the second opening with the step of the second keeper engaging the second latch.

9. The system of claim 8, further comprising a key extending from a position adjacent the proximal end of the storage drive carrier between the first arm and second arm, and a third opening defined in the substrate of the chassis between the first keeper and the second keeper, the key of the storage drive carrier being received within the third opening of the substrate.

10. The system of claim 8, further comprising a tab extending from a position adjacent the distal end of the storage drive carrier between the first and second pins, and a protrusion comprising resilient material that is mounted to the chassis between the first and second retainers, the tab mechanically contacting the protrusion.

11. The system of claim 8, where the chassis further comprises a second substrate oriented in perpendicular relationship to the first substrate, the second substrate supporting the first and second retainers.

12. A method, comprising:
positioning a storage drive carrier between first and second retainers of a chassis, a first opening defined in the first retainer and a second opening defined in the second retainer;
simultaneously positioning a first pin extending outward from a first side of the storage drive carrier into the first opening and a second pin extending outwardly from an opposite second side of the storage drive carrier into the second opening, the first and second pins defining a pivot axis therebetween; and
pivoting the storage drive carrier about the pivot axis to engage a latch having a profile defined by a ramp and a step supported on a flexible arm extending from the storage drive carrier with a keeper of the chassis by flexing the flexible arm between a first position in which the step is not engaged by the keeper and a second position in which the step is engaged by the keeper at the same time that the first and second pins are received by the respective first and second openings and with the flexible arm biasing the latch to maintain the step of the latch engaged by the keeper to mechanically secure the storage drive carrier to the chassis.

13. The method of claim 12, where the first and second retainers are spaced apart to interchangeably receive either a plastic tool-less storage drive carrier or a sheet metal tooled storage drive carrier between the first and second retainers with the first opening receiving the first pin extending outward from the first side of either the tool-less or tooled storage drive carrier at the same time that the second opening receives the second pin extending outward from the opposite second side of the tool-less or tooled storage drive carrier, and with the keeper engaging the latch extending from either the tool-less or tooled storage drive carrier with the flexible arm biasing the latch to maintain the step of the latch engaged by the keeper at the same time that the first and second pins are received by the respective first and second openings to mechanically secure either the tool-less or tooled storage drive carrier to the chassis.

14. A method, comprising:
positioning a storage drive carrier between first and second retainers of a chassis, a first opening defined in the first retainer and a second opening defined in the second retainer;
simultaneously positioning a first pin extending outward from a first side of the storage drive carrier into the first opening and a second pin extending outwardly from an opposite second side of the storage drive carrier into the second opening, the first and second pins defining a pivot axis therebetween; and
pivoting the storage drive carrier about the pivot axis to engage a latch extending from the storage drive carrier in a direction perpendicular to the pivot axis with a keeper of the chassis at the same time that the first and second pins are received by the respective first and second openings to mechanically secure the storage drive carrier to the chassis;
where the storage drive carrier comprises first and second latches and has opposing proximal and distal ends, each of the first and second sides of the storage drive carrier extending from the proximal end of the storage drive carrier to the distal end of the storage drive carrier; where the storage drive carrier further comprises first and second arms extending from the storage drive carrier adjacent the proximal end of the storage drive carrier, a distal end of the first arm supporting the first latch and a distal end of the second arm supporting the second latch; where the first pin and the second pin extend outward from the respective first and second sides of the storage drive carrier adjacent the distal end of the storage drive carrier; and
where the method further comprises engaging the first latch of the storage drive carrier with the first keeper of the chassis and engaging the second latch of the storage drive carrier with the second keeper of the chassis at the same time that the first and second pins of the storage drive carrier are received by the respective first and second openings of the chassis to mechanically secure the storage drive carrier to the chassis.

15. The method of claim 14, further comprising positioning at least one data storage drive in mounted position within the storage drive carrier prior to the positioning of the storage drive carrier between first and second retainers of a chassis.

16. The method of claim 14, where the first and second latches of the storage drive carrier each have a profile defined by a ramp and a step; and where the method further comprises:
flexing each of the flexible first and second arms between a first position in which the step of its latch is not engaged by a respective one of the first and second keepers and a second position in which the step of its latch is engaged by a respective one of the first and second keepers to secure the storage drive carrier to the chassis; and
using each of the flexible first and second arms to bias its respective first or second latch toward the second position to maintain its respective step engaged by the respective one of the first and second keepers.

17. The method of claim 16, where the chassis further comprises a first substrate, the first keeper and the second keeper provided on the first substrate with a first opening defined in the first substrate adjacent and contiguous with the first keeper, and a second opening defined in the first substrate adjacent and continuous with the second keeper; where the method further comprises:
simultaneously positioning the first arm in the first opening to engage the step of the first latch with the first keeper and positioning the second arm in the seconds opening to engage the step of the second latch with the second keeper.

18. The method of claim 17, further comprising positioning a key of the storage drive carrier within a third opening defined in the substrate of the chassis between the first keeper and the second keeper; where the key extends from a position adjacent the proximal end of the storage drive carrier between the first arm and second arm, and the third opening defined in the substrate of the chassis between the first keeper and the second keeper.

19. The method of claim 17, further comprising mechanically contacting a tab of the storage drive carrier with a protrusion mounted to the chassis between the first and second retainers while the storage drive carrier is secured to the chassis; where the tab extends from a position adjacent the distal end of the storage drive carrier between the first and second pins; and
where the protrusion of the chassis comprises resilient material that is mounted to the chassis between the first and second retainers.

20. A storage drive carrier, comprising:
a first pin extending outward from a first side of the storage drive carrier, and a second pin extending outward from an opposite second side of the storage drive carrier to define a pivot axis therebetween, each of the first and second sides of the storage drive carrier extending from a proximal end of the storage drive carrier to a distal end of the storage drive carrier; and
at least one latch having a profile defined by a ramp and a step supported on a flexible arm extending from the storage drive carrier;
where the step of the latch is configured to be engaged by a keeper of a chassis to secure the storage drive carrier to the chassis at the same time that the first and second pins are received by respective first and second openings of the chassis, with the flexible arm being flexible between a first position in which the step of the latch is not engaged by the keeper and a second position in which the step of the latch is engaged by the keeper, and with the flexible arm biasing the latch toward the second position to maintain the step engaged by the keeper to mechanically secure the storage drive carrier to the chassis.

* * * * *